US008640081B2

(12) United States Patent
Hastings et al.

(10) Patent No.: US 8,640,081 B2
(45) Date of Patent: Jan. 28, 2014

(54) GRAPHICAL USER INTERFACE FOR DISPLAY OF SYSTEM RESISTANCE

(71) Applicant: Cypress Semiconductor Corporation, San Jose, CA (US)

(72) Inventors: Mark Hastings, Mukilteo, WA (US); Chris Keeser, Everett, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/888,148

(22) Filed: May 6, 2013

(65) Prior Publication Data

US 2013/0298100 A1    Nov. 7, 2013

Related U.S. Application Data

(60) Provisional application No. 61/643,683, filed on May 7, 2012, provisional application No. 61/776,107, filed on Mar. 11, 2013.

(51) Int. Cl.
*G06F 17/50* (2006.01)

(52) U.S. Cl.
USPC ............ 716/139; 716/116; 716/117; 716/128

(58) Field of Classification Search
USPC .................................. 716/116–117, 128, 139
See application file for complete search history.

(56) References Cited

U.S. PATENT DOCUMENTS

| | | | | |
|---|---|---|---|---|
| 5,991,522 A * | 11/1999 | Shoen | ............................ | 716/103 |
| 6,301,696 B1 * | 10/2001 | Lien et al. | ...................... | 716/116 |
| 6,631,510 B1 * | 10/2003 | Betz et al. | ...................... | 716/121 |
| 6,643,834 B2 * | 11/2003 | Satoh et al. | .................... | 716/139 |
| 6,978,435 B2 * | 12/2005 | Anderson et al. | ............. | 716/117 |
| 7,210,115 B1 * | 4/2007 | Rahim et al. | ................... | 716/113 |
| 7,398,497 B2 * | 7/2008 | Sato et al. | ...................... | 716/112 |
| 8,201,137 B1 * | 6/2012 | Bhushan et al. | .............. | 716/139 |
| 8,209,650 B2 * | 6/2012 | St. John et al. | ................. | 716/111 |
| 8,266,575 B1 * | 9/2012 | Ogami et al. | ................. | 716/138 |
| 8,286,125 B2 * | 10/2012 | McDonald et al. | ........... | 716/138 |
| 8,332,805 B1 * | 12/2012 | Birch et al. | .................... | 716/139 |
| 8,499,270 B1 * | 7/2013 | Best et al. | ...................... | 716/117 |
| 2003/0035417 A1 * | 2/2003 | Zirojevic et al. | .............. | 370/357 |
| 2003/0056186 A1 * | 3/2003 | Satoh et al. | ...................... | 716/10 |
| 2003/0079188 A1 * | 4/2003 | McConaghy et al. | ............ | 716/2 |
| 2003/0131323 A1 * | 7/2003 | McConaghy | ...................... | 716/2 |
| 2005/0028113 A1 * | 2/2005 | Lin et al. | ............................ | 716/3 |
| 2006/0261846 A1 * | 11/2006 | Twigg et al. | ..................... | 326/37 |
| 2007/0130553 A1 * | 6/2007 | Wang et al. | ..................... | 716/11 |
| 2011/0239174 A1 * | 9/2011 | Sode | ............................. | 716/109 |

* cited by examiner

*Primary Examiner* — Stacy Whitmore

(57) ABSTRACT

Techniques for determining resistances of analog routes in electronic designs are described herein. In an example embodiment, a computer system receives first user input that indicates, in a user interface, a first component in an electronic design. The electronic design has been placed and routed for a programmable target device. The computer system receives second user input that selects, in the user interface, a particular component from one or more second components of the electronic design, where the one or more second components have analog connectivity to the first component. The computer system determines a resistance value of an analog route between the first component and the particular component, and displays the resistance value in association with the analog route in the user interface.

20 Claims, 16 Drawing Sheets

| Identifier | User Name | Chip Name | Subckt Name | Value |
|---|---|---|---|---|
| Xcy_probe1 | iPGA_1_SC_vin | cy_SC0_vin | cy_probe | 10.54 |
| Xcy_probe2 | P07_0 | cy_GPIO_P0_7 | cy_probe | 18.26 |
| Xcy_probe3 | iDAC8_1_viDAC8_iout | cy_iDAC8_iout | cy_probe | 3.12 |
| Name | Node1 | Node2 | | Value |
| Rcy_1 | cy_496 | cy_494 | | 9.88 |
| Rcy_2 | cy_494 | cy_491 | | 9.13 |
| Rcy_3 | cy_1115 | cy_1194 | | |
| Rcy_4 | cy_514 | cy_1115 | | |
| Rcy_5 | cy_1194 | cy_494 | | |
| Rcy_6 | cy_845 | cy_1115 | | 133 |
| Rcy_7 | cy_845 | cy_GPIO_P0_7 | | 43.75 |
| Rcy_8 | cy_845 | cy_iDAC8_iout | | 38.4 |
| Rcy_9 | cy_1194 | cy_SC0_vin | | 591.93 |
| Ccy_1 | cy_491 | 0 | | 919.75p |
| Ccy_2 | cy_494 | 0 | | 1944.24p |
| Ccy_3 | cy_496 | 0 | | 310.62p |
| Ccy_4 | cy_1194 | 0 | | 224.24p |
| Ccy_5 | cy_1115 | 0 | | 669.83p |
| Ccy_6 | cy_514 | 0 | | 103.29p |

GRAPHICAL USER INTERFACE FOR DISPLAY OF SYSTEM RESISTANCE

PRIORITY

This application claims the priority and benefit of U.S. Provisional Application No. 61/643,683 filed on May 7, 2012, the entire contents of which are incorporated by reference herein; this application also claims the priority and benefit of U.S. Provisional Application No. 61/776,107, filed on Mar. 11, 2013, the entire contents of which are incorporated by reference herein.

TECHNICAL FIELD

This disclosure relates to the field of Electronic Design Automation (EDA).

BACKGROUND

Field-programmable Gate Arrays (FPGAs) and Programmable Logic Devices (PLDs) have been used in data communication and telecommunication systems. Conventional PLDs and FPGAs consist of a digital array of programmable elements, with the elements programmed to implement a fixed function or equation by processing digital signals. However, in developing complex integrated circuits, there is often a need for additional components that process and/or generate analog signals, such as operational and instrument amplifiers, filters, timers, analog-to-digital and digital-to-analog converters, etc. As a general rule, implementation of such analog components creates additional difficulties such as extra space for new components, increased power consumption, and additional steps during the design, testing, and production processes. All of these factors can significantly affect the cost and development cycle of a given product.

Because of the ever-increasing design complexity of electronic products, the capabilities of the EDA programs (tools) used in the design process become ever more important in reducing the cost and development cycle of such products. For example, the capabilities of EDA tools may be key in helping a user/designer to evaluate early in the design process how the circuitry of a given design would perform on a given device. Such EDA tool capabilities become even more important when an electronic design needs to be implemented on a device (e.g., such as a system-on-chip) with programmable interconnects that are used to carry analog signals between arbitrary or nearly arbitrary sets of component terminals and/or input/output pins.

By way of illustration, a programmable interconnect of a device may include a large number of traces and switches that are programmed (e.g., in the firmware of the device) to implement a large number of routes between various components. However, while a large number of traces and switches produce a more flexible interconnect, each trace and switch traversed by a signal on a given route may degrade the quality of that signal. Thus, during the design process it may be important for a user/designer to quantify such signal degradation even where the signal current is a few microamperes (µA or µAmps) and/or depending on the particular functional purpose of the signal.

BRIEF DESCRIPTION OF THE DRAWINGS

FIG. 9B is a block diagram illustrating the SPICE output for the example circuit schematic of FIG. 9A.

DETAILED DESCRIPTION

Figure 1A:
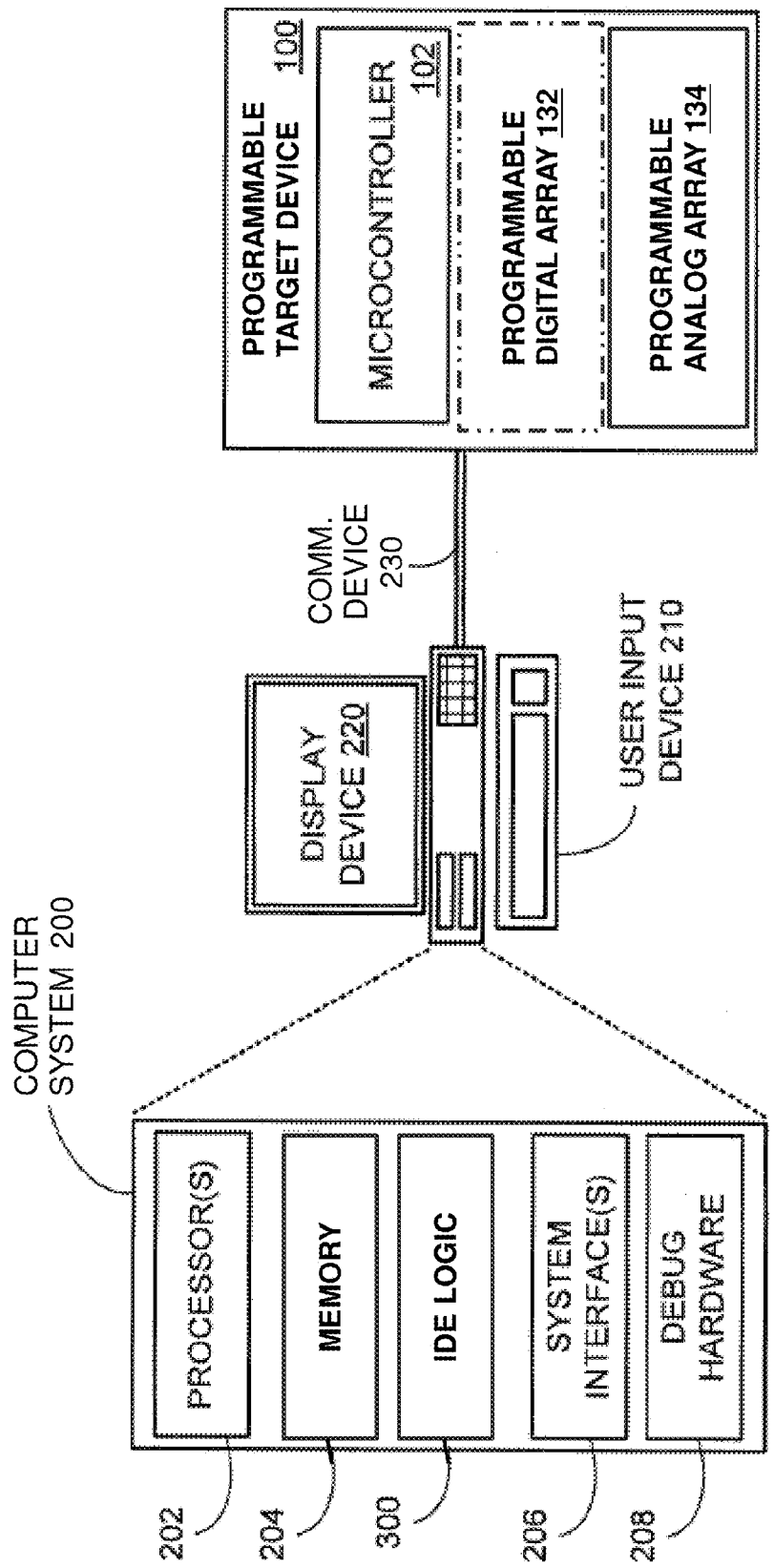
FIG. 1A illustrates an example operational context in which embodiments may be implemented.

The following description sets forth numerous specific details such as examples of specific systems, components, methods, and so forth, in order to provide a good understanding of various embodiments of the techniques for determining resistances of analog routes in electronic designs described herein. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

References in the description to "an embodiment", "one embodiment", "an example embodiment", "some embodiments", and "various embodiments" mean that the particular feature, structure, or characteristic being referred to is included in at least one embodiment of the invention. Further, the appearances of the phrases "an embodiment", "one embodiment", "an example embodiment", "some embodiments", and "various embodiments" in various places in the description do not necessarily all refer to the same embodiment(s).

As used herein, "electronic design" refers to a dataset that includes representation of physical electronic components and/or hardware circuitry that can be implemented on a device. In some embodiments, the techniques for determining analog route resistance described herein may be implemented for a mixed-signal electronic design having an analog portion (with analog architecture that includes components through which analog signals can be routed) and digital portion (with digital architecture that includes components through which digital signals can be routed). In some embodiments, the techniques described herein may be implemented for an electronic design that has a predominant analog portion with a few digital components (e.g., such as components that convert a digital signal to an analog signal). In other embodiments, the techniques described herein may be implemented for an electronic design that has a predominant digital portion with a few analog components that form analog routes (e.g., such as components that convert analog signals to digital signals).

In various embodiments, the techniques for determining analog route resistance described herein may comprise one or more methods that are executed by one or more computer systems or computing devices. Although the operations of such method(s) are shown and described hereinafter in a particular order, the operations of each method may be altered so that certain operations may be performed in a different order or so that certain operation may be performed, at least in part, concurrently and/or in parallel with other operations. In other embodiments, instructions or sub-operations of distinct operations may be executed in an intermittent and/or alternating manner. Thus, the various method embodiments of the described techniques, as well as the order of operations therein, are to be regarded in an illustrative rather than a restrictive sense.

I. OVERVIEW

When a signal traverses a route in a device, the route has resistance and this resistance causes an I*R (Current*Resistance) voltage drop. Typically, during the product design phase such resistance is presumed to be negligible, but for circuits in some devices (e.g., such as a system-on-chip) it may not be actually negligible. Thus, knowledge of an actual or approximated route resistance would give a user/designer a better idea of what performance results can be expected from a given circuit that includes the route. For example, if a user/designer determines that the resistance of a route is too high, the user/designer can estimate whether the resulting voltage drop across the route would cause undesirable results or unacceptable performance.

In some devices that operate on digital signals by using digital circuitry (e.g., such as FPGAs and PLDs), the voltage drop across a signal route may not be significant because a small voltage drop (e.g., in the order of mV, or milliVolts, and even above) does not change the operation of the digital circuitry. For example, the logic signal levels used in various digital circuitry typically have at least 1.5 volts (or more) difference between a logic "0" and a logic "1", thereby making the digital circuitry less susceptible and less sensitive to smaller voltage drops (e.g., in the order of a few hundred mV). However, in other devices that operate on analog signals, a voltage drop in the order of a few hundred mV may be significant since it may be the difference between an analog component working properly and the analog component working in an unpredictable or undesirable way.

For example, in programmable devices that allow signals to be routed differently depending on different firmware-based configurations, it can be important to a user/designer to fully understand the resistance of a route taken by a particular signal. For analog signals, this can be very important even in the case where the signal current is a few µAmps. However, determining the magnitude of the resistance of a given route during a product design phase can be very time consuming, if even possible, especially for a complicated route that includes multiple switches and traces.

To address these issues, techniques are described herein for determining analog route resistance in electronic designs. The techniques described herein (e.g., as embodied in an EDA tool) allow a user/designer to investigate the resistances of analog signal routes to determine if he or she should be concerned about possible voltage drops. For example, the techniques described herein allow a user/designer to evaluate the performance of an electronic circuit in a device (e.g., such as a system-on-chip) quickly and easily during a product design phase, instead of conducting complicated tests during the product testing phase or, even worse, by having to guess route resistances and voltage drops.

According to the techniques described herein, in some embodiments the resistance values determined for analog routes may be accurate to a measurement-level precision—for example, by accounting for signal voltage, temperature, and other parameters that affect the resistance of elements along a route. In some embodiments, the resistance values determined for analog routes may be less accurate—for example, just so a user/designer could be aware of the magnitude of the route resistance. In some embodiments, an EDA tool may provide a graphical user interface and associate logic that allows a user/designer to find a route with the least amount of resistance in order to optimize performance.

In an example embodiment of the techniques described herein, a computer system receives first user input that indicates, in a user interface, a first component in an electronic design. The electronic design has been placed and routed for a programmable target device. The computer system receives second user input that selects, in the user interface, a particular component from one or more second components of the electronic design, where the one or more second components have analog connectivity to the first component. The computer system determines a resistance value of an analog route between the first component and the particular component, and displays the resistance value in association with the analog route in the user interface.

In other embodiments, the techniques for determining analog route resistance described herein may be embodied as a set of instructions that are stored on non-transitory computer-readable storage media. Such instructions, when executed by one or more processors of a computer system, cause the one or more processors to perform the techniques described herein. In yet other embodiments, the techniques described herein may be embodied as an apparatus comprising one or more processors and non-transitory media that stores a set of instructions. The set of instructions, when executed by the one or more processors, causes the apparatus to perform the techniques described herein.

II. EXAMPLES OF OPERATIONAL CONTEXTS, PROGRAMMABLE TARGET DEVICES, AND DESIGN AUTOMATION FLOWS

FIG. 1A illustrates an example operational context in which embodiments of the techniques for determining analog route resistance described herein may be implemented.

Referring to FIG. 1A, an exemplary programmable target device 100 is configured and/or programmed by computer system 200. Programmable target device 100 includes microcontroller 102 and configurable hardware components, such as programmable array of analog blocks 134 and possibly programmable array of digital blocks 132. Microcontroller 102 can be programmed (and re-programmed) and the programmable digital and analog arrays 132 and 134 can be configured (and reconfigured) to implement various applications and to perform a variety of functions.

An exemplary computer system 200 may be configured and/or programmed to execute processing logic that is configured and operable to perform the described techniques for determining analog route resistance. As used herein, "logic" refers to a set of instructions which, when executed by one or more processors, are configured and operable to perform one or more functionalities. In various embodiments and implementations, any such logic may be implemented as one or more software components that are executable by one or more processors (e.g., such as central processing units, or CPUs), as one or more hardware components (e.g., such as Application-Specific Integrated Circuits, or ASICs), or as any combination of one or more software and hardware components. For example, any particular logic may be implemented, without limitation, as a standalone and/or client-server software application, as one or more software modules, as one or more libraries of functions, as one or more dynamically linked libraries, as one or more active X controls, and/or as one or more browser plug-ins. Further, in various embodiments the functionalities of any particular logic may be implemented in the same integrated module or may be combined in two or more modules that may provide some additional functionality. When executed on a computer system or in a distributed computing environment, a particular logic may be embodied as one or more computer processes, threads, or any other run-time entities that are allocated computing resources (e.g., such as memory, CPU time, persistent storage, and network bandwidth) to perform the logic's functionalities.

As illustrated in FIG. 1A, computer system 200 is configured to execute integrated development environment (IDE) logic 300, allowing for unified hardware and software development and for configuration of programmable target device 100 with hardware configuration files and software programming. Computer system 200 can include one or more processors 202 to execute IDE logic 300, for example, by executing instructions stored in memory 204 or in other computer-readable volatile and/or non-volatile storage media.

After hardware configuration files and software programming are generated, computer system 200 can program and/or configure programmable target device 100 with the developed hardware configuration and software programming, for example, through communication device 230. In some embodiments, device 230 can be a wired device, such as a Universal Serial Bus (USB) device, network interface card (e.g., such as Ethernet card), and the like, or it can be a wireless communication device that can establish a wireless link between computer system 200 and programmable target device 100.

Computer system 200 may also include system interface(s) 206 that allow the computer system to communicate with external devices, such as user input device 210, display device 220, and programmable target device 100. For example, computer system 200 may include a system interface 206 to communicate with programmable target device 100 over communication device 230. In some embodiments, system interface(s) 206 can receive inputs, for example, through input device 210, and present information, for example, via display device 220.

Computer system 200 and/or IDE logic 300 can generate hardware configuration and/or software applications for programmable target device 100 in response to user input, for example, from input device 210. IDE logic 300 can include various development tools and/or programs that allow system designers to describe hardware circuitry for programmable target device 100, and to implement and provide software or firmware code for microcontroller 102. In some embodiments, IDE logic 300 can receive hardware description code that describes this hardware circuitry in an abstracted or generic manner, and can convert the generic code into device-specific configuration files that are particular to the architecture and/or resources (e.g., interconnects and other routing resources) of programmable target device 100. The hardware description code provided by the system designers may include schematic circuit diagrams and/or hardware code written according to a hardware description language, such as Verilog or VHDL.

Computer system 200 and/or IDE logic 300 can also generate application programming interfaces (APIs) based at least in part on the hardware description code. These APIs, when provided to programmable target device 100, can program microcontroller 102 to communicate with programmable digital and analog arrays 132 and 134 that are configured according to the device-specific configuration files.

Computer system 200 and/or IDE logic 300 can send the device-specific configuration files and the application programming interfaces to programmable target device 100. Programmable target device 100 can utilize the configuration files to configure particular hardware components in the programmable digital and/or analog arrays 132 and 134 to implement the hardware circuitry described by the hardware description code. Programmable target device 100 can utilize the application programming interfaces to program the microcontroller 102 to communicate with the programmable digital and/or analog arrays 132 and 134 that are configured according to the device-specific configuration files.

After programmable target device 100 has been programmed with the hardware configuration and software/firmware programming developed with IDE logic 300, computer system 200 can execute debug hardware 208 to perform debugging operations on programmable target device 100. In some embodiments, debug hardware 208 can be located externally from computer system 200 and can communicate with the computer system via a system interface 206.

In various embodiments, a computer system such as computer system 200 may execute instructions to configure (and re-configure) various programmable target devices. Examples of such programmable devices include, but are not limited to, various programmable systems-on-chip or other systems that include one or more processors, microcontrollers, field-programmable analog arrays (FPAAs), or other processing devices that have configurable hardware components, such as, for example, interconnects with analog switches, programmable analog arrays, and/or other components such as programmable digital arrays.

One example of a programmable system-on-chip is a device from the Programmable System-on-Chip (PSoC™) family of products offered by Cypress Semiconductor Corporation of San Jose, Calif. A computer system, such as computer system 200, can execute processing logic that allows designers to develop applications for, and program, both the configurable hardware components and the microcontroller of the PSoC™ device.

Figure 1B:
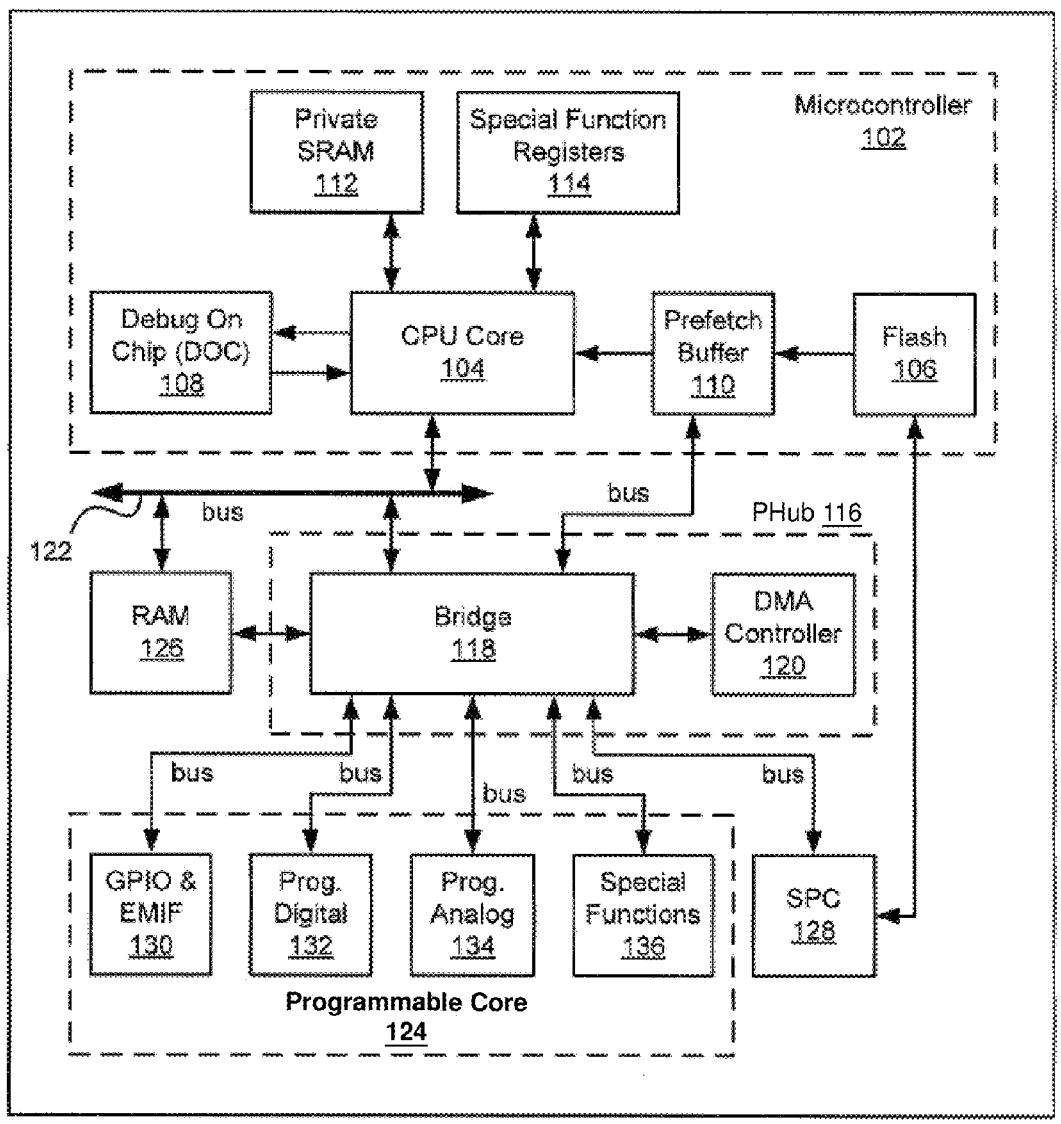
FIG. 1B is a block diagram illustrating an example programmable target device for which various embodiments may be implemented.

FIG. 1B illustrates an example embodiment of a programmable system-on-chip device 101. In some embodiments, a system-on-chip device (e.g., such as device 101) is manufactured as a set of integrated circuits on one chip of semiconductor material. Device 101 includes microcontroller 102. Microcontroller 102 includes CPU core 104 (which may include one or more processors), flash program storage 106, DOC (Debug-On-Chip) 108, prefetch buffer 110, private SRAM (Static Random Access Memory) 112, and special functions registers 114. In an embodiment, DOC 108, prefetch buffer 110, private SRAM 112, and special function registers 114 may be coupled to CPU core 104, while flash program storage 106 may be coupled to prefetch buffer 110. Flash program storage 106 can be any type of program memory.

Device 101 may also include PHub (Peripheral Hub) 116, which may include bridge 118 (e.g., such as a single-level or multi-level Advanced High-Performance Bus Bridge) and optionally a DMA (Direct Memory Access) controller 120 that is coupled to microcontroller 102 via bus 122. PHub 116 may provide the primary data and control interface between microcontroller 102 and its peripherals and memory, and programmable core 124. DMA controller 120 may be programmed to transfer data between system elements without burdening CPU core 104. In various embodiments, each of these subcomponents of microcontroller 102 and PHub 116 may be different with each choice or type of CPU core 104. PHub 116 may also be coupled to shared SRAM 126 and SPC (System Performance Controller) 128. Private SRAM 112 is independent of the shared SRAM 126, which is accessed by microcontroller 102 through bridge 118. CPU core 104 accesses the private SRAM 112 without going through bridge 118, thus allowing local register and RAM accesses to occur simultaneously with DMA access to shared SRAM 126. Although labeled here as SRAM, these memory modules may be any suitable type of a wide variety of (volatile or non-volatile) memory or data storage modules in various other embodiments.

In various embodiments and implementations, programmable core 124 may include various combinations of subcomponents (not shown), including, but not limited to, global routing channels, digital processing channels, digital peripherals, analog processing channels, analog peripherals, DMA controller(s), SRAM and other appropriate types of data storage, IO ports, and other suitable types of subcomponents. In the example embodiment illustrated in FIG. 1A, programmable core 124 includes GPIO (General Purpose IO) and EMIF (Extended Memory Interface) block 130 to provide a mechanism to extend the external off-chip access of microcontroller 102, programmable digital array 132, programmable analog array 134, and special functions array 136, each configured to implement one or more of the subcomponent functions. In various embodiments, special functions array 136 may include dedicated (non-programmable) functional blocks and/or one or more interfaces to dedicated functional blocks, such as a USB, a crystal oscillator drive, a JTAG (Joint Test Action Group) interface, and the like.

Programmable digital array 132 may include an array of digital logic blocks and associated routing. In one embodiment, the digital block architecture is comprised of UDBs (Universal Digital Blocks). For example, each UDB may include an ALU (Arithmetic Logic Unit) together with CPLD (Complex PLD) functionality or other types of digital programmable logic functions.

In various embodiments, one or more UDBs of programmable digital array 132 may be configured to perform various digital functions, including, but not limited to, one or more of the following functions: a basic $I^2C$ slave; an $I^2C$ master; a SPI (Serial Peripheral Interface) master or slave; a multi-wire (e.g., 3-wire) SPI master or slave (e.g., MISO/MOSI multiplexed on a single pin); timers and counters (e.g., a pair of 8-bit timers or counters, a 16-bit timer or counter, a 8-bit capture timer, or the like); pulse-width modulators, or PWMs (e.g., a pair of 8-bit PWMs, a 16-bit PWM, a 8-bit deadband PWM, or the like); a level sensitive I/O interrupt generator; a quadrature encoder; an Universal Asynchronous Receiver/Transmitter, or UART (e.g., half-duplex); delay lines; and any other suitable type of digital function or combination of digital functions which can be implemented in one or more UDBs.

In other embodiments, additional functions may be implemented using a group of two or more UDBs. Merely for purposes of illustration and not limitation, the following functions may be implemented using multiple UDBs: an $I^2C$ slave that supports hardware address detection and the ability to handle a complete transaction without CPU core intervention and to help prevent the force clock stretching on any bit in the data stream; an $I^2C$ multi-master which may include a slave option in a single block; an arbitrary length cyclical redundancy check, or CRC (e.g., up to 32 bits); secure digital input/output, or SDIO; serial general purpose input/output, or SGPIO; a digital correlator (e.g., having up to 32 bits with 4× over-sampling and supporting a configurable threshold); a LIN (Local Interconnect Network) bus interface; a delta-sigma modulator (e.g., for class D audio DAC having a differential output pair); an integrated interchip sound, or $I^2S$ (stereo); a liquid crystal display, or LCD, drive control (e.g., UDBs may be used to implement timing control of the LCD drive blocks and provide display RAM addressing); full-duplex UART (e.g., 7-, 8- or 9-bit with 1 or 2 stop bits and parity, and RTS/CTS support); a capture timer (e.g., 16-bit or the like); a deadband PWM (e.g., 16-bit or the like); a system management bus, or SMbus (including formatting of SMbus packets with CRC in software); a brushless motor drive (e.g., to support 6/12 step commutation); auto BAUD rate detector and generator (e.g., automatically determine BAUD rate for standard rates from 1200 to 115200 BAUD and after detection to generate required clock to generate BAUD rate); and any other suitable type of digital function or combination of digital functions which can be implemented in multiple UDBs.

Programmable analog array 134 may include analog components including, but not limited to, comparators, mixers, PGAs (Programmable Gain Amplifiers), TIAs (Trans-Impedance Amplifiers), ADCs (analog-to-digital converters), DACs (digital-to-analog converters), voltage references, current sources, sample and hold circuits, analog interconnects (and switches thereof), and any other suitable type of analog components and resources. Programmable analog array 134 may support various analog functions including, but not limited to, analog routing, LCD drive IO support, capacitive sensing, voltage measurement, motor control, current to voltage conversion, voltage to frequency conversion, differential amplification, light measurement, inductive position monitoring, filtering, voice coil driving, magnetic card reading, acoustic doppler measurement, echo-ranging, modem transmission and receive encoding, or any other suitable type of analog function.

Figure 2:
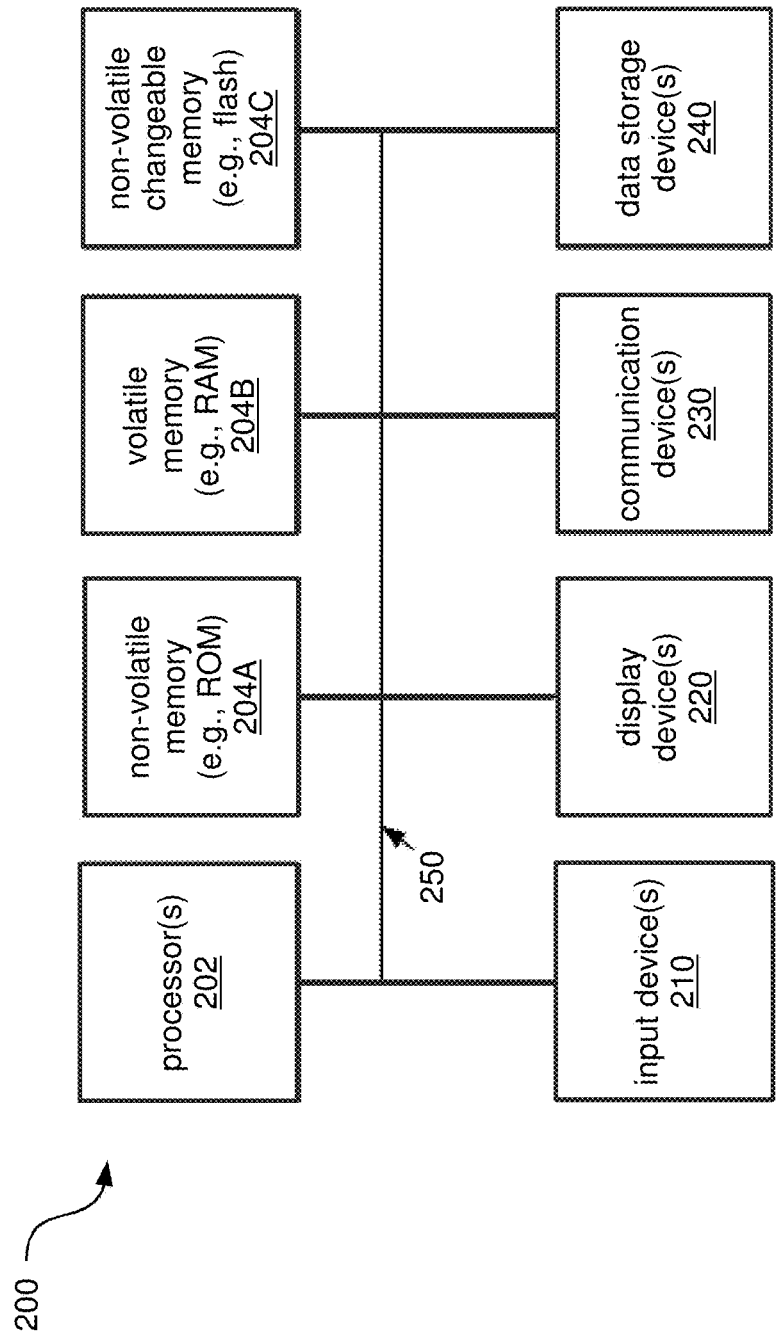
FIG. 2 is a block diagram illustrating an example computing device on which various embodiments may be implemented.

FIG. 2 illustrates basic hardware components that may be included in computer system 200, which may form a hardware platform for executing an IDE logic or other EDA tools, according to example embodiments of the techniques for determining analog route resistance described herein. Computer system 200 includes one or more address/data buses 250 for communicating data, one or more processors 202 functionally coupled with bus 250 for processing data and executing instructions, non-volatile memory 204A (e.g., read-only memory, or ROM) coupled with bus 250 for storing static data and instructions for processor(s) 202, and volatile memory 204B (e.g., random access memory, or RAM) coupled with bus 250 for storing data and executable instructions for processor(s) 202. Computer system 200 may also include one or more system interfaces (not shown), and a changeable, non-volatile memory 204C (e.g., flash memory, EPROM, and the like) for storing data and/or firmware instructions for processor(s) 202 that can be replaced and/or updated after the manufacture of the computer system.

Computer system 200 may also include one or more input devices 210 and one or more display devices 220 that are coupled to processor(s) 202 over bus 250. Input device(s) 210 may include an alphanumeric input device (e.g., such as a touch-sensitive or typewriter-style keyboard), a pointing device that provides spatial input data (e.g., such as a computer mouse or equivalent device), and/or any other suitable human interface device that can communicate user commands and other user-generated information to processor(s) 202. Display device(s) 220 may include a liquid crystal display (LCD) device, cathode-ray tube (CRT) monitor, field emission device (FED, or "flat panel" CRT) device, light emitting diode (LED) display device, plasma display device, electro-luminescent display device, or any other display device suitable for creating graphic images and alphanumeric characters recognizable to the user.

Computer system 200 may also include one or more communication devices 230 and one or more data storage devices 240 that are coupled to processor(s) 202 over bus 250. Communication device(s) 230 are configured to transmit and receive data to and from other computer systems and/or computing devices. For example, communication device(s) 230 may include a USB controller and bus for communicating with USB peripheral devices, a network interface card (NIC) for communicating over wired communication networks, and/or wireless network card that can implement a variety of wireless data-transmission protocols, for example IEEE 802.11 and/or Bluetooth. Data storage device(s) 240 are configured for persistently storing data and information that is used by computer system 200 and/or by its user(s). Data storage devices 240 may include persistent storage media of one or more types including, but not limited to, electromagnetic disks (e.g., hard disks), optical storage disks (e.g., CD-ROMs), magneto-optical storage disks, solid-state drives, USB flash drives, and the like.

Figure 3:
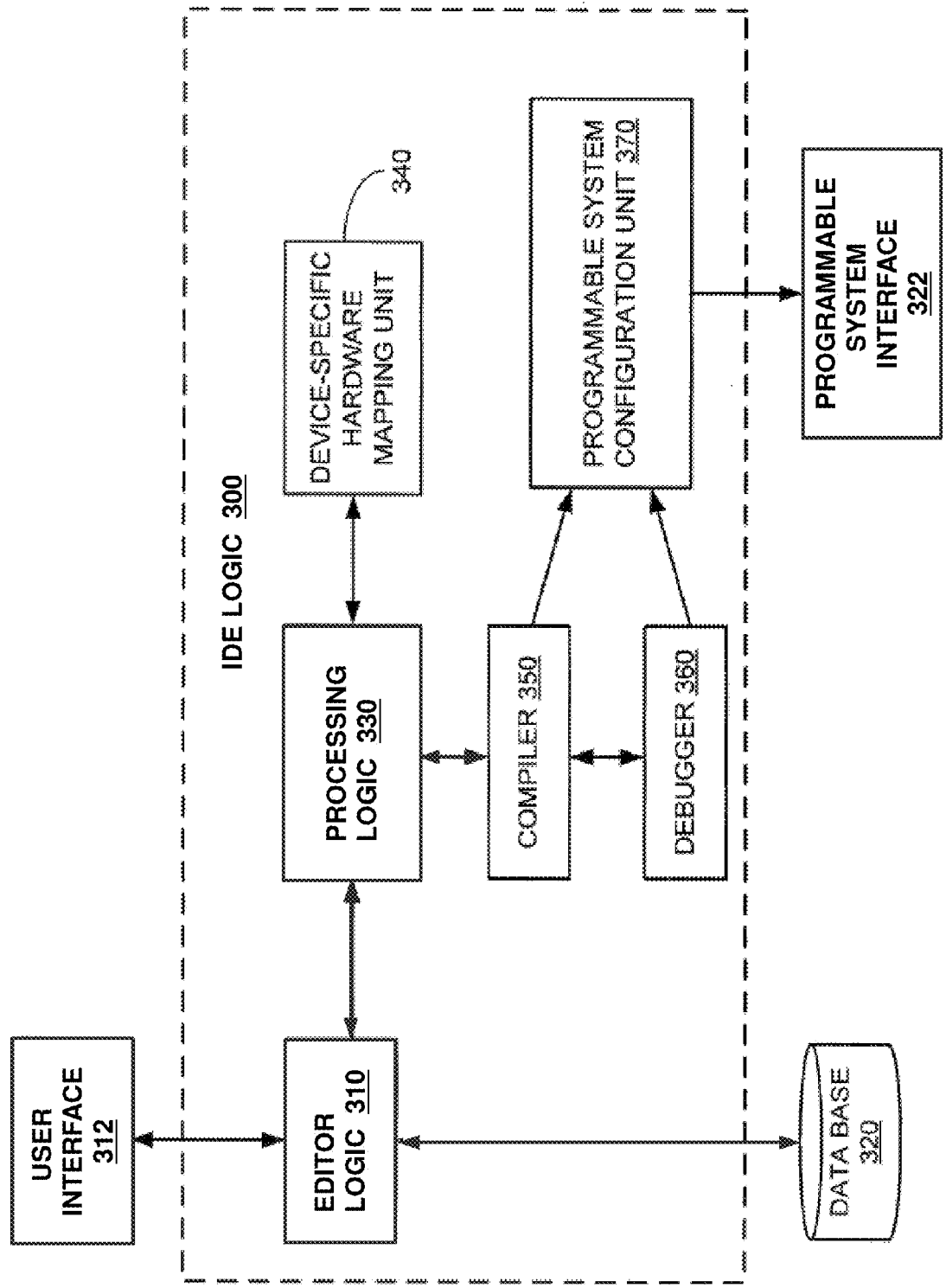
FIG. 3 is a block diagram illustrating an example integrated development environment that may be used to implement various embodiments.

FIG. 3 illustrates an example embodiment of an IDE logic (e.g., such as IDE logic 300 in FIG. 1A). Referring to FIG. 3, IDE logic 300 may be implemented as one or more modules that are stored in volatile or non-volatile memory and are executable by one or more computer systems. In some embodiments, an IDE logic may be at least partially implemented by a set of one or more discrete hardware components (not shown) in a computer system or another computing device.

In the embodiment illustrated in FIG. 3, IDE logic 300 includes editor logic 310 to receive and edit information describing hardware circuitry. The information describing hardware circuitry can be received from various sources and in various formats, for example, through one or more user interfaces 312. In some embodiments, user interface 312 may include a graphical user interface (GUI). As used herein, "graphical user interface (GUI)" refers to a structured set of graphical visual objects (e.g., windows, dialog boxes, frames, panels, menus, buttons, icons, etc.) that are rendered by a computer system (or logic thereof) on a display device to convey graphical and/or textual information to a user, and to receive input data from the user. In some embodiments, user interface 312 may include a command-line interface (CLI). As used herein, "command-line interface (CLI)" refers to a run-time process (e.g., such as an operating system shell process) that is configured to receive textual information from a user and/or to display textual information in a display device.

Editor logic 310 can include (and/or invoke) various development tools that present a user/designer with options for inputting circuit designs or descriptions thereof to IDE logic 300. For example, editor logic 310 can receive code written according to a hardware description language, such as Verilog or VHDL. Editor logic 310 can also provide a graphics-based circuit design application, such as a Schematic Editor, a Symbol Editor, etc., which allow designers and other users to create schematic diagrams of the hardware circuitry to be implemented by a programmable target device (e.g., such as programmable target device 100 in FIG. 1A). In some embodiments, editor logic 310 can access database 320 to determine dependencies, build rules, and debug rules for the received descriptions of the hardware circuitry.

Editor logic 310 can also receive user-generated program code from user interface 312 or from other system interface. The program code can utilize at least one application programming interface generated by the IDE logic to communicate with the hardware components in a programmable target device (e.g., such as programmable target device 100 in FIG. 1A). This program code can also include at least one application programming interface to allow a processor or a microcontroller in the programmable target device, when programmed with the code, to communicate with hardware components in the target device.

According to the techniques for determining analog route resistance described herein, in some embodiments editor logic 310 may also be configured to receive, from a user through user interface 312, input data that specifies components of an electronic design that is being opened, accessed, and/or edited by the editor logic. In these embodiments, editor logic 310 may be further configured to search for an analog route between two user-specified components, select (and possibly show to the user) the analog route that is found, determine the resistive elements included in the analog route, look up the resistances of the resistive elements in database 320, compute or otherwise determine the total resistance value of the analog route, and render in user interface 312 a visual object that displays the analog route and its total resistance value.

IDE logic 300 also includes processing logic 330, which may be configured to perform various functionalities. For example, processing logic 330 may be configured to generate configuration files from the received descriptions of the hardware circuitry. In some embodiments, when the received descriptions of the hardware circuitry are in an abstracted or generic format, processing logic 330 can access a device-specific hardware mapping unit 340 to map the received descriptions of the hardware circuitry to the programmable digital and/or analog components of a programmable target device. In other words, the processing logic can determine where and how the programmable target device implements the circuitry provided by the user/designer. This level of abstraction allows users without specific knowledge of the programmable target device to program and configure the target device to perform various applications through the use of generic circuit descriptions and diagrams. Processing logic 330 can also be configured to generate the configuration files from the device-specific version of the hardware circuitry descriptions.

Processing logic 330 may also generate one or more application programming interfaces (APIs) from the received descriptions of the hardware circuitry. For example, an application programming interface, when provided to a programmable target device, can program one or more processors or microcontrollers to allow them to communicate with hardware components of the target device.

As illustrated in FIG. 3, IDE logic 300 also includes a compiler 350 to compile the configuration files and/or the application programming interfaces and link them into executables and/or firmware code that can be loaded onto a programmable target device (e.g., such as programmable target device 100 in FIG. 1A). Once the configuration files and the application programming interfaces have been compiled and linked, compiler 350 can provide them to programmable system configuration unit 370 to send them to the programmable target device, for example, via a programmable system interface 322. The programmable target device can configure its programmable digital and/or analog arrays according to the configuration files and program its microcontroller according to the application programming interfaces in order to implement the hardware circuitry described by the user/designer.

Compiler 350 can also provide the configuration files and the application programming interfaces to debugger 360 (e.g., such as debug hardware 208 in FIG. 1A). Debugger 360 can perform debugging operations on the programmable target device that is configured with the configuration files and the application programming interfaces. For example, debugger 360 can perform step over, step into, and step out operations, which allows users the ability to perform incremental evaluations that step through programming code.

Various embodiments of the techniques for determining analog route resistance described herein may be implemented as a computer program product that may include instructions stored on non-transitory computer-readable media, e.g., such as volatile storage and/or non-volatile storage. For example, a computer program product may include executable instructions that implement IDE logic 300, editor logic 310, and/or processing logic 330, as described above with respect to FIG. 3. These instructions may be used to program one or more computer systems or computing devices that include one or more general-purpose or special-purpose processors (e.g., CPUs) or equivalents thereof (e.g., such as processing cores, processing engines, microcontrollers, and the like). When executed by the processor(s) or the equivalents thereof, the instructions cause the computer systems or computing devices to perform the operations that comprise the techniques for determining analog route resistance described herein. A non-transitory computer-readable medium may also include one or more mechanisms for storing or transmitting information in a form (e.g., software, processing application, etc.) that is readable by a machine (e.g., such as a computing device or a computer system). Such non-transitory computer-readable storage medium may include, but is not limited to, electromagnetic storage medium (e.g., floppy disks, hard disks, and the like), optical storage medium (e.g., CD-ROMs and the like), magneto-optical storage medium, read-only memory (e.g., ROM and the like), random-access memory (e.g., RAM and the like), erasable programmable memory (e.g., EPROM, EEPROM, and the like), flash memory, or another now-known or later-developed type of medium that is suitable for storing information and/or executable instructions.

Additionally, some embodiments of the techniques described herein may be practiced in distributed computing environments where the computer-readable medium is stored on, and/or executed by, more than one computing device or computer system. One example of such distributed computing environment is a client-server environment where some of the various functionalities of the techniques described herein may be performed by a client computer system and/or some of the functionalities may be performed by a server computer system. Another example of such distributed computing environment is a cloud computing environment. In a cloud computing environment, computing resources are provided and delivered as a service over a network such as a local-area network (e.g., LAN) or a wide-area network (e.g., the Internet). Examples of cloud-based computing resources may include, but are not limited to: physical infrastructure resources (e.g., physical computing devices or computer systems, and virtual machines executing thereon) that are allocated on-demand to perform particular tasks and functionalities; platform infrastructure resources (e.g., an operating system or OS, programming language execution environments, database servers, web servers, and the like) that are installed/imaged on-demand onto the allocated physical infrastructure resources; and application software resources (e.g., application servers, single-tenant and multi-tenant software platforms, and the like) that are instantiated and executed on-demand in the environment provided by the platform infrastructure resources. In various distributed computing environments, the information transferred between the various computing devices and/or computer systems may either be pulled or pushed across the transmission medium connecting the computing devices and/or computer systems.

Figure 4:
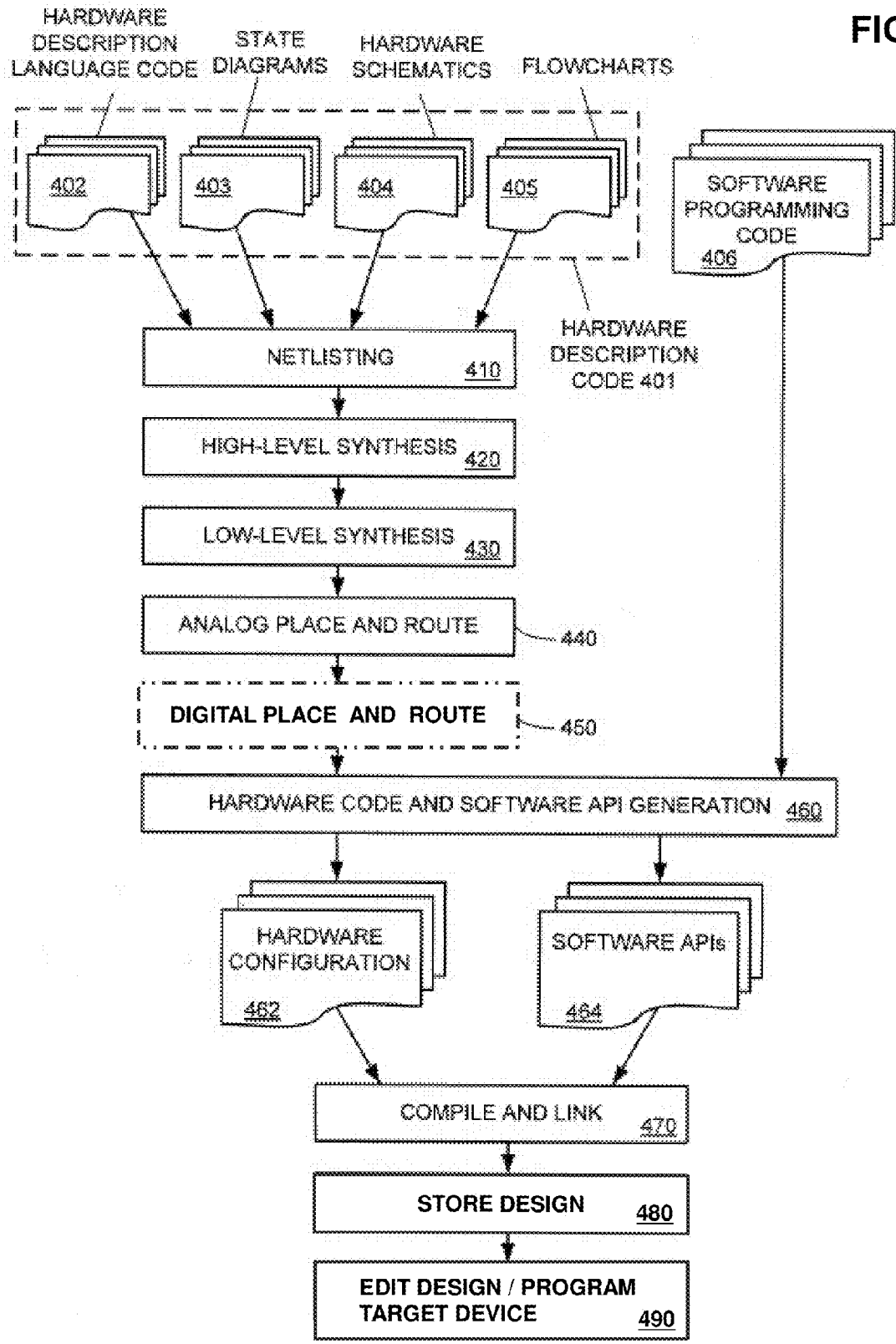
FIG. 4 illustrates a design automation flow according to an example embodiment.

FIG. 4 is a block diagram illustrating a design automation flow according to one embodiment. The various steps of the flow in FIG. 4 are described hereinafter as being performed by an editor logic, a processing logic, a compiler, and a debugger (e.g., such as editor logic 310, processing logic 330, compiler 350, and debugger 360 of FIG. 3) that are executed by one or more computer systems. It is noted, however, that various implementations and embodiments may use different, and possibly multiple, components to perform the operations of the flow in FIG. 4. For example, in various embodiments such components may be implemented in a single integrated component or their functionality may be spread across two or more components that may perform some additional operations and functionalities. Thus, the description hereinafter of the flow in FIG. 4 is to be regarded in an illustrative rather than a restrictive sense.

Referring to FIG. 4, an editor logic receives hardware description code 401, such as hardware description language code 402, state diagrams 403, hardware schematics 404, and flowcharts 405, which describe the hardware circuitry of an electronic design. The hardware circuitry can include one or more circuits to perform various applications/functions and analog and/or digital signal routing associated with the circuits. Hardware description language code 402 can be written in Verilog, VHDL, or other similar hardware description language. Hardware schematics 404 can be schematic diagrams of the hardware circuitry created with a graphics-based circuit design application, such as a Schematic Editor, a Symbol Editor, etc. After receiving the hardware description code 401

(and/or any user edits thereto), the editor logic passes the hardware description code to a processing logic.

In block 410, the processing logic performs netlisting of hardware description language code 402, state diagrams 403, hardware schematics 404, and/or flowcharts 405, to generate a single representation (e.g., such as a netlist) of the hardware circuitry to be implemented by a programmable target device (e.g., such as programmable target device 100 of FIG. 1A). For example, as part of netlisting, the processing logic can combine and integrate the circuitry descriptions, which may have various formats, into a single netlist that represents the entire hardware circuitry.

In block 420, the processing logic performs high-level synthesis on the netlist that represents hardware description code 401. As part of the high-level synthesis, the processing logic breaks down (e.g., reduces) the netlisted hardware description code into lower level analog and digital primitives, logic equations, flip-flops, and/or other low-level components, and stores the reduced description code in (or in association with) the corresponding netlist.

In block 430, the processing logic maps the reduced hardware description code in the netlist to the programmable target device through low-level synthesis. As part of the low-level synthesis, the processing logic: (1) determines which hardware resources or components within the programmable target device (e.g., such as components in programmable analog arrays and/or programmable digital arrays) can implement the circuitry components and primitives described by the reduced hardware description code in the netlist; and (2) stores in (or in association with) the netlist a mapping that associates instances representing the components and primitives with the corresponding hardware resources of the programmable target device.

In block 440, the processing logic performs placement and routing of the analog blocks and components of the electronic design specified in hardware description code 401. As part of the placement and routing, the processing logic determines the locations where the analog circuitry is to be placed in the programmable analog array(s) of the target device. As part of the placement and routing, the processing logic may also allocate or set the analog signal routing for the hardware circuitry of the electronic design, for example, by specifying and storing the state (e.g., open or closed) of any switches that are part of the analog interconnect(s) of the target device. If the electronic design includes any digital blocks or components, in block 450 the processing logic may also perform digital placement and routing that determines the locations where the digital circuitry is to be placed in the programmable digital array(s) of the target device.

In block 460, the processing logic generates hardware configuration files 462 and application programming interfaces 464. For example, the processing logic generates hardware configuration files 462 based on the netlist of the reduced hardware description code and based on the placement and routing performed in blocks 440 and 450. The processing logic generates application programming interfaces 464 based on software programming code 406 received from at least one system interface, and possibly based on the netlist of the reduced hardware description code and on the placement and routing performed in blocks 440 and 450. Software programming code 406 may include at least one application programming interface to allow a processor or a microcontroller in the programmable target device, when programmed with the software programming code, to communicate with hardware components in the target device.

In block 470, a compiler compiles and links application programming interfaces 464 into executable code (e.g., such as firmware), and also compiles and/or otherwise prepares hardware configuration files 462 for loading to the programmable target device (e.g., in the form of firmware configuration). After block 470 is completed, the electronic design specified in hardware description code 401 is considered to be "placed and routed" for the programmable target device—for example, a representation (e.g., such as the combination of the hardware configuration and software APIs) of the placed and routed design has been generated and can be programmed into a target device to implement the functionalities and operations defined in the design.

In block 480, the compiler (or other logic such as the processing logic) stores the placed and routed electronic design into persistent storage. In various embodiments, a placed and routed electronic design may be stored in any suitable storage media and in any suitable data structures or formats. Examples of suitable storage media include, but are not limited to, various volatile and/or non-volatile computer-readable storage media as described heretofore. Examples of suitable data structures and formats include, but are not limited to, one or more files (e.g., such as design project files), one or more data records (e.g., records stored in relational, hierarchical, or object-oriented databases), one or more sets of data objects instantiated from object-oriented classes, and/or any other suitable structured data arrangements that can store persistent or in-memory data.

In block 490, the compiler (or other logic such as the editor and/or processing logic) may send the compiled and linked hardware configuration files 462 and application programming interfaces 464 to the programmable target device. In this manner, the programmable target device (e.g., such as programmable target device 100 in FIG. 1A) is configured to implement the hardware circuitry of the electronic design (e.g., as defined in hardware description code 401) responsive to the hardware configuration files and the application programming interfaces. Alternatively, or in addition to, in block 490 the editor logic may access and/or open a placed and routed electronic design for further editing that is initiated by a user/designer. Finally, in block 490 a debugger may also execute a debugging application to debug the programmable target device when any issues are found or when a design (or a re-design) needs to be tested.

In some embodiments, the processing logic can receive an indication to initiate automatic configuration and programming of the programmable target device after receiving the input information 401 and 406. The processing logic and/or the compiler can automatically perform some or all operations associated with the blocks 410-490 in response to receiving the indication. In some embodiments, the indication can be received from a user/designer via at least one of the system interfaces.

III. EXAMPLE METHODS FOR DETERMINING ANALOG ROUTE RESISTANCE

Figure 5:
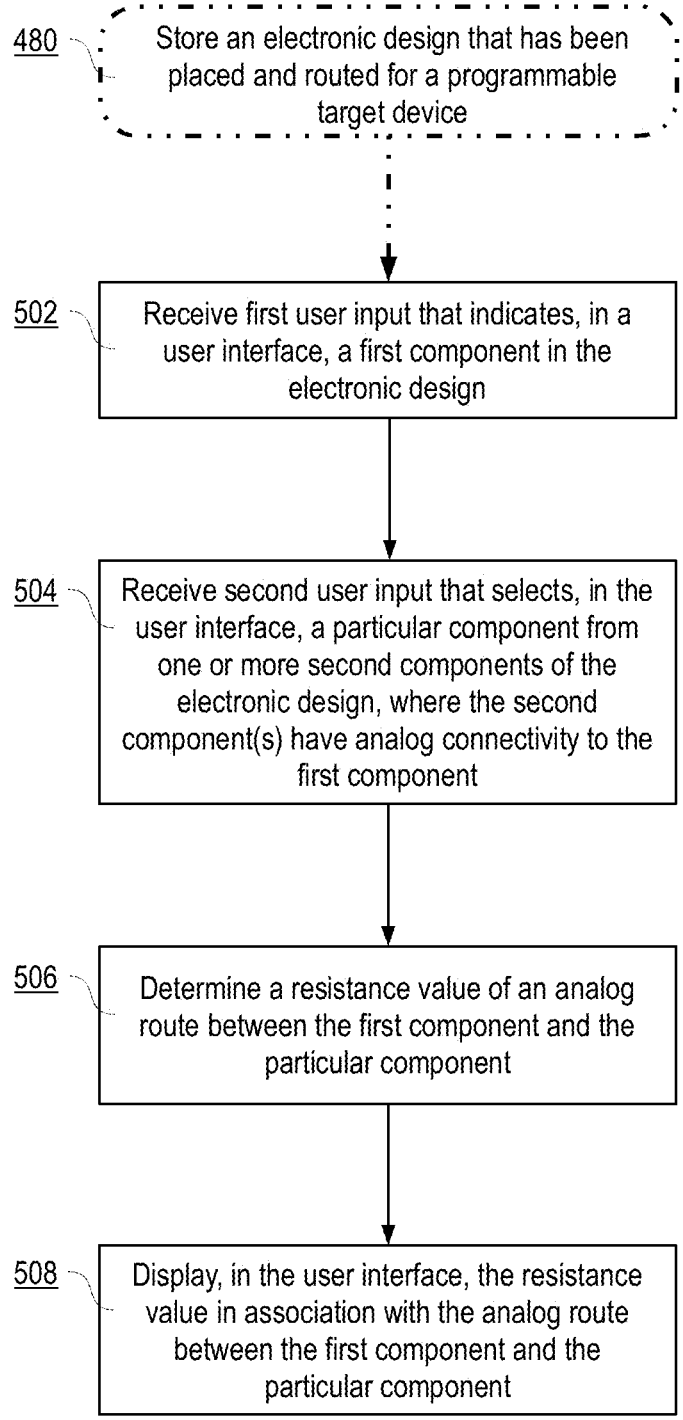
FIG. 5 is a flow diagram illustrating an example method for determining resistances of analog routes in electronic designs according to one embodiment.

FIG. 5 is a flow diagram illustrating an example method for determining route resistance according to the techniques described herein. The operations in the blocks of FIG. 5 are described hereinafter as being performed by editor logic that is executed by one or more computer systems. It is noted, however, that various implementations and embodiments may use different, and possibly multiple, components to perform the method of FIG. 5. For example, in various embodiments such components may be implemented in a single integrated component or their functionality may be spread across two or more components that may perform some additional operations and functionalities. Thus, the description hereinafter of the method in FIG. 5 is to be regarded in an illustrative rather than a restrictive sense.

In some embodiments, a placed and routed electronic design is stored as discussed heretofore with respect to block 480 in FIG. 4. For example, an electronic design is considered to be "placed and routed" for a programmable target device when a representation of the design (e.g., such as the design's hardware configuration and software APIs) has been generated and can be programmed into the target device to implement the functionalities and operations defined in the design. In various embodiments, a placed and routed electronic design (and/or a representation thereof) may be stored in various volatile and/or non-volatile computer-readable storage media and in various data structures and formats such as, for example, files, data records, data objects, and any other suitable structures and formats that can store persistent or in-memory data.

Referring to FIG. 5, in block 502 an editor logic receives first user input in a user interface. The first user input indicates a first component in the placed and routed electronic design. For example, in some embodiments, the editor logic may receive the user input through a CLI. In some embodiments, the editor logic may receive the user input through a graphical user interface, where the input visually indicates the first component in a graphical visual representation of the design. In some embodiments, the electronic design has been placed and routed for a specific type and/or model of a programmable target device.

As used herein, "programmable device" (or "programmable target device") refers to a device that includes one or more interconnects (e.g., such as an analog interconnect) with hardware components (e.g., such as switches, multiplexers, hubs, etc.) that can be configured/programmed and/or re-configured/re-programmed by firmware configuration (e.g., such as software and/or hardware configuration files) that is installed on the device. Typically, in a programmable device there are multiple routes for connecting two components of the device. In some embodiments, a programmable device may include an analog interconnect that includes a set of switches, multiplexers, hubs, and/or other analog components, where the analog interconnect carries analog signals between multiple device components, and where the configuration of the analog interconnect is controlled by firmware configuration that is installed into the device. For example, depending on the architecture of a programmable device and on the electronic design that has been placed and routed for it, an API or other software module generated for the electronic design may specify and/or dynamically control which switches of an interconnect are open (and/or which switches of the interconnect are closed) during various operations performed by the device, thereby defining which route(s) of the multiple possible routes between two given components of the device can be traversed by a signal.

In block 504, the editor logic receives second user input in the user interface. The second user input selects a particular component from one or more components of the electronic design that have analog connectivity to the first component indicated by the first user input (per the operation in block 502).

As used herein, two components are considered to have "analog connectivity" if at least one analog route exists between the two components in a placed and routed electronic design. As used herein, "analog route" refers to a path between two components along which an analog signal can travel; such analog route may include one or more analog components (e.g., switches, traces, nodes, and other resistive elements) that are configured to process and/or pass through the analog signal without or without modification.

In block 506, the editor logic determines (or invokes another logic to determine) a resistance value of the analog route between the two components indicated by the user (per the operations of blocks 502 and 504). For example, in some embodiments the editor logic examines the electronic design (or a representation thereof) to determine one or more resistive elements that are included in the analog route. The editor logic then looks up the resistive element(s) of the analog route in a database to determine their resistance(s), and then uses the resistance(s) to compute or otherwise determine the total resistance value of the analog route. In some embodiments, the determined resistance value is an approximation that is close to the actual value for the analog route. In some embodiments, a more accurate resistance value for the analog route may be computed by taking into account various parameters that affect resistance (e.g., such as operating temperature of the device, the expected signal voltage or voltage range, the like). The values of such parameters can be pre-determined, for example, by characterization of the various analog components included in the programmable target device, or by performing simulations that model the operation of the target device under various conditions.

In block 508, the editor logic displays the analog route and its determined resistance value in the user interface. For example, in some embodiments that use a CLI, the editor logic may display text that indicates the start and end components of the analog route and the determined resistance value. In some embodiments that user a graphical user interface (GUI), the editor logic may render one or more visual objects in the GUI. For example, one visual object may identify the analog route by an appropriate visual characteristic (e.g., such as color, shading, highlighting the endpoints of the route, etc.) and another visual object (e.g., a dialog box) may identify the determined resistance value of the analog route and, possibly, the route's endpoints with respect to the placed and routed electronic design.

It is noted that the techniques for determining analog route resistance described herein are different with respect to other techniques that may involve route resistance. By way of illustration, the techniques described herein are particularly suitable for implementing electronic designs on programmable target devices that include a large number of switches, traces, and other resistive elements (e.g., such as a number of switches in the range of 10-100 switches, and/or in the range of 100-500 switches, and/or in ranges above 500 switches).

For example, some chip products (e.g., such as a chip with a few analog routes) may have a fixed and limited number of switches (e.g., such as 3-4 switches). In such products, it is relatively easy for a user/designer to figure out which switch will be used on which analog route and to approximate the route resistance based on the datasheet specifications for the particular switch. But in a programmable device that includes a large number of switches (e.g., in the tens, hundreds, or even more) that are configured by/based-on embedded firmware, analog routes can change a lot from design to design and even from one placement/routing of an electronic design to another placement/routing of the design on the same programmable target device. Thus, it would be difficult (if at all possible) for a user/designer to figure out the switches on individual analog routes, and would be impossible to figure out the resistances of such routes. In contrast, in some embodiments the techniques described herein address this problem by automatically determining all the resistive elements (e.g., traces, switches, etc.) for an analog route specified by a user/designer, and then automatically determining and displaying the resistance of the route to the user/designer.

In another example, some conventional EDA tools can perform placement and routing of electronic designs for FPGAs. However, such EDA tools typically do not compute resistance of analog routes. Rather, to the extent that an FPGA includes analog routes, a conventional EDA tool typically computes trace lengths internally (e.g., as part of placement) and does not compute resistance of entire routes that may include resistive elements other than traces (e.g., such as switches and other analog components along a route). In contrast, in some embodiments the techniques described herein provide for determining the resistance values for entire analog routes that are specified by a user/designer in an EDA tool.

In another example, some conventional printed circuit board (PCB) tools may include components to compute resistance or impedance (e.g., for a PCB board that runs a large number of traces at high, MHz range frequencies). However, such conventional PCB tools are not configured to (and cannot) process electronic designs that are placed and routed for programmable target devices in which switches are configured based on programmable firmware configurations. In contrast, in some embodiments the techniques described herein provide for determining the resistance values for entire analog routes of an electronic design that is placed and routed for programmable target devices (e.g., such as on-chip systems).

In another example, some EDA tools may include components that evaluate the timing of electronic design circuits. However, such timing tools typically only perform evaluations to find out whether a trace is good or bad, and do not calculate the resistance of a route as a whole, because there is no need to interactively display such information to a user/designer. In contrast, in some embodiments the techniques described herein provide for determining the resistance of an analog route specified by a user/designer, and then for displaying the determined resistance in a user interface on a display device.

Figure 6:
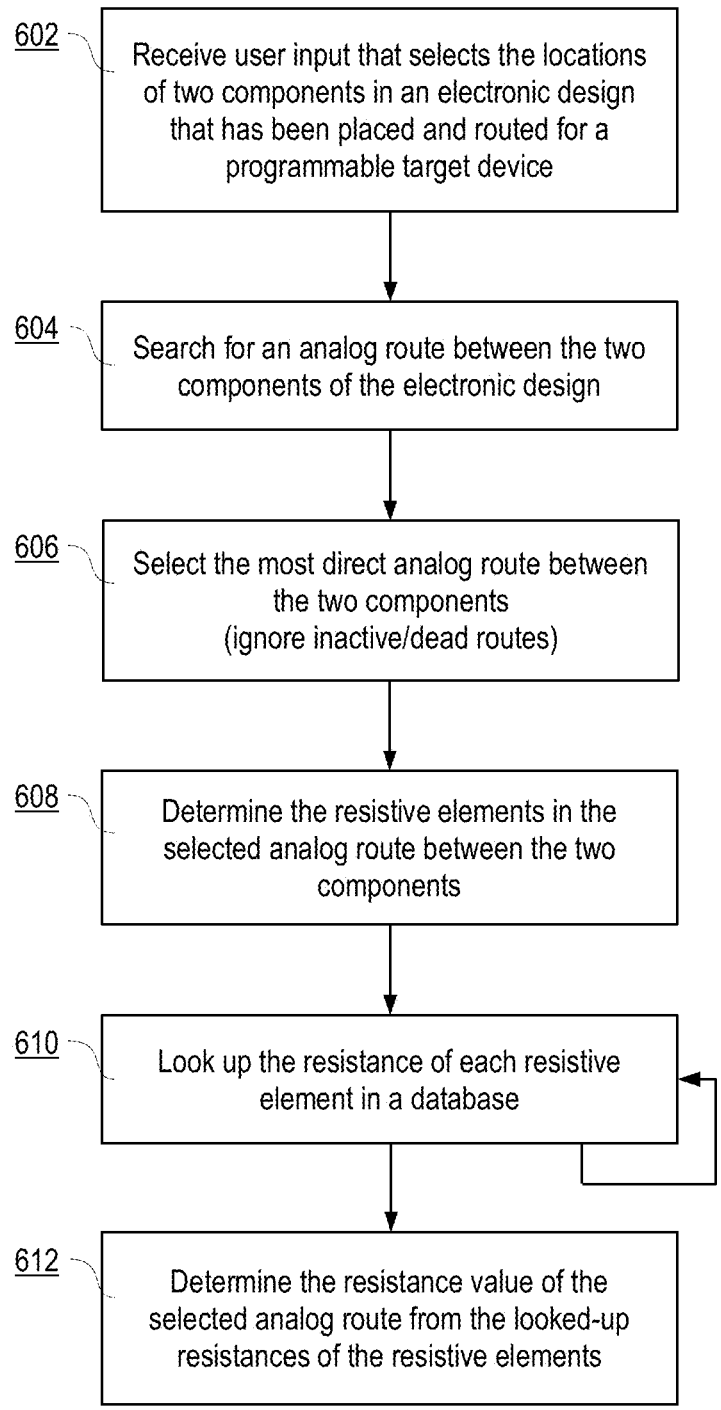
FIG. 6 is a flow diagram illustrating another example method for determining resistances of analog routes in electronic designs according to one embodiment.

FIG. 6 is a flow diagram illustrating another example method for determining resistances of analog routes in electronic designs. The operations in the blocks of FIG. 6 are described hereinafter as being performed by editor logic that is executed by one or more computer systems. It is noted, however, that various implementations and embodiments may use different, and possibly multiple, components to perform the method of FIG. 6. For example, in various embodiments such components may be implemented in a single integrated component or their functionality may be spread across two or more components that may perform some additional operations and functionalities. Thus, the description hereinafter of the method in FIG. 6 is to be regarded in an illustrative rather than a restrictive sense.

In block 602, the editor logic receives user input that selects the locations of two components in an electronic design. For example, in some embodiments the editor logic may receive a request from a user (e.g., such as selection from a menu, click on an icon, etc.) to determine analog route resistance. In response to the user request, the editor logic may render a graphical representation of the electronic design in a user interface and may prompt the user to indicate one (or both) of the components of interest. When the user has indicated the locations of the components in the graphical representation of the electronic design, the editor logic proceeds with the operations in block 604.

In block 604, the editor logic searches for an analog route between the two user-selected components of the electronic design. For example, in some embodiments the editor logic may determine—e.g., from the user input(s) received in block 602—the identity (e.g., IDs) of the two components based on their locations in the representation of the electronic design. Based on the two components' identities, the editor logic may then search a database or other storage structures for an analog route between the two components. For example, in order to find the analog route between the two components, the editor logic (or another software component) may search the nets and/or the netlist(s) that are included as part of the representation of the electronic design.

As used herein, "net" refers to one or more data structures that store the connection(s) that connect one or more components and/or the terminals or pins thereof. (By way of illustration, a net may represent the connections that comprise a circuit). As used herein, "netlist" refers to one or more data structures that store data describing the net(s), component(s), connectivity, and other properties of the circuitry of an electronic design. In some embodiments, a netlist comprises a list of instances and other connectivity and design information such as nets, input pins, output pins, clocks, etc., and their definitions and attributes, where "instance" refers to a data object that represents a component in a netlist. In various embodiments and implementations, nets and netlists may be implemented as various types of data structures stored on volatile and/or non-volatile storage media. Examples of such data structures include, but are not limited to, files, tables, lists (e.g., structured lists, length-name-value pairs lists, and the like), data records (e.g., records stored in relational, hierarchical, or object-oriented databases), data objects instantiated from object-oriented classes, arrays, and/or any other suitable structured data arrangements that can store persistent or in-memory data.

In block 606, the editor logic selects the most direct analog route from all the routes between the two user-selected components that were found by the operations of block 604. In some embodiments, in block 606 the editor logic may ignore inactive (or dead) routes between the two components. (As used herein, "active" route is a route that can conduct an electrical signal, and "inactive" or "dead" route is a route that cannot electrically conduct a signal.) For example, in embodiments in which the electronic design is placed and routed for a programmable target device, the editor logic may determine whether an analog route between the two user-selected components is active or dead by examining the hardware (or firmware) configuration associated with the design and determining which switches along the route are closed and which switches are open.

After determining the analog route between the two user-selected components, in block 608 the editor logic determines the resistive element(s) that are included in the route. (As used herein, "resistive element" refers to a component that is partially or fully electrically resistive in nature; examples of resistive elements include, but are not limited to, switches, traces, and other components that exhibit electrical resistance when a signal is applied thereto.) For example, in some embodiments the editor logic may examine the net(s) covered by the analog route and may determine the identity (e.g., component ID) and/or the type of the resistive element(s) that comprise the route's net(s).

In block 610, the editor logic (or another logic) looks up the resistance of each resistive element that was determined as being part of the analog route by the operations of block 608. In some embodiments, a database may be provided for the programmable target device, where the database includes data structures (e.g., such as lists or tables) with all resistive elements of the device along with their corresponding model resistances. The database may identify each resistive element of the target device by element ID or element type (e.g., type of trace, type of switch, etc.), and may store the model resistance of the element or of the element type along with, possibly, other characteristics of the element (e.g., such as capacitance, cross-capacitance, etc). For example, for switches the database may store the resistances per switch type and for traces the database may store the node-to-node resistances between the nodes connected by the traces, where the switch and node-to-node resistances may be obtained by characterizations performed for the target device and/or by simulations. Thus, in some embodiments the editor logic may traverse the net(s) covered by the analog route element-by-element, and may determine the resistance of each resistive element in the route by looking up the resistive element in the database by element ID or type and retrieving the corresponding element resistance.

In block 612, the editor logic determines the total resistance value for the analog route between the two user-selected components. For example, in some embodiments the editor logic may sum up the resistances that were looked up by the operations in block 610 for the resistive elements in the analog route. Since temperature (e.g., such as the temperature at which the target device would operate) affects the resistance of various resistive elements (e.g., such as conductive traces), in some embodiments the total resistance value for the analog route is determined for some standard (e.g., such as room) temperature that is also reported to the user. After determining the total resistance value of the analog route in block 612, the editor logic displays the determined total resistance value and the analog route (e.g., as identified by its start and end components) in a user interface on a display device.

Figure 7:
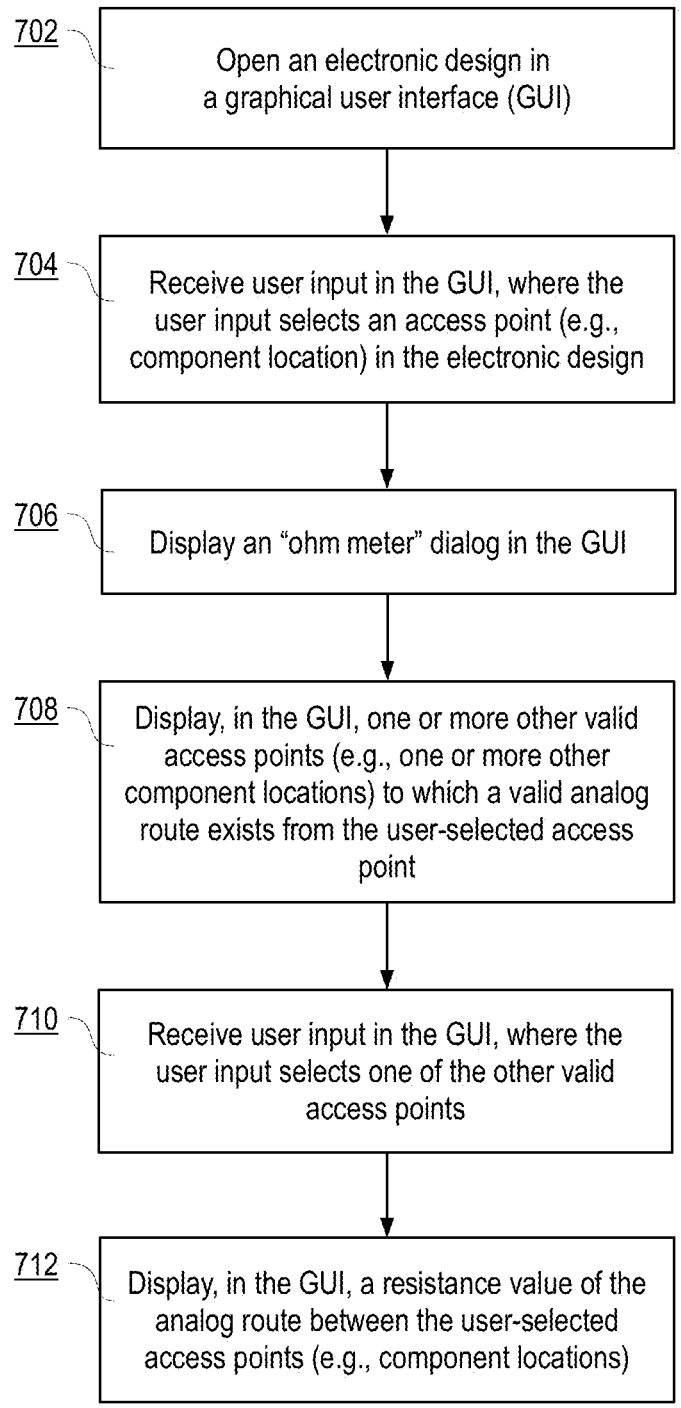
FIG. 7 is a flow diagram illustrating an example method of using a graphical user interface to determine and display analog route resistance according to one embodiment.

FIG. 7 is a flow diagram illustrating an example method of using a graphical user interface to determine and display analog route resistance. The operations in the blocks of FIG. 7 are described hereinafter as being performed by editor logic that is executed by one or more computer systems. It is noted, however, that various implementations and embodiments may use different, and possibly multiple, components to perform the method of FIG. 7. For example, in various embodiments such components may be implemented in a single integrated component or their functionality may be spread across two or more components that may perform some additional operations and functionalities. Thus, the description hereinafter of the method in FIG. 7 is to be regarded in an illustrative rather than a restrictive sense.

In block 702, the editor logic opens a representation of an electronic design in a graphical user interface (GUI). For example, in response to a user request, the editor logic may access one or more design project files in a file system and may open the file(s) in the workspace area of an IDE. In some embodiments, the graphical user interface is a structured set of graphical visual objects that are rendered on a display device by a set of instructions that are executed as part of the editor logic (and/or of another logic). By way of illustration, the set of instructions may comprise executable and/or interpretable instructions that are generated from one or more objected-oriented classes that implement the set of graphical visual objects. Examples of graphical visual objects include, but are not limited to, windows, forms, tabs, menus, frames, toolbars, content panes, panels, dialog boxes, buttons, icons, pins, text fields/boxes, drop-down lists/boxes, list boxes, check boxes, combo boxes, tables, lists, labels, sliders, progress bars, scroll bars, status bars, tables, and any other graphical objects that can visually represent information in a graphical user interface.

In block 704, the editor logic receives user input in the GUI. The user input indicates a request to determine analog route resistance and visually selects an access point in the representation of the electronic design rendered in the GUI. The editor logic displays in the GUI a visual object (e.g., such as a pin) that marks the selected access point, thereby indicating the location of the design component corresponding to the access point. Thus, in some embodiments the "access point" is a design location that identifies a particular design component. Examples of such design component include, but are not limited to, an input/output (I/O) pin of the target device, an input or output terminal of a node or a block (analog or digital), a switch terminal, and an input or output terminal of an analog component such as a comparator, mixer, PGA, TIA, ADC, DAC, voltage reference source, current source, and the like.

In response to the user input received in block 704, in block 706 the editor logic displays (or causes the rendering of) a dialog box in the GUI. For example, in some embodiments the editor logic may display a dialog box labeled with intuitive text—e.g., such as "Ohm Meter".

In response to, in parallel with, or after performing the operations of block 706, the editor logic determines one or more other valid access points to which active analog routes exist from the user-selected access point. For example, in some embodiments the editor logic may determine all active analog routes that start at the component identified by the user-selected access point and end at component(s) identified by some other access point(s) in the electronic design. Then, in block 708 the editor logic displays one or more visual objects (e.g., such as pins) that mark the other access point(s) in the GUI, thereby prompting (and allowing) the user to select an active route only from the available and active routes that start from the user-selected access point. In some embodiments, the editor logic may display in the GUI a connected broken line (or other visual object) that indicates the selected route in addition to displaying other visual objects that mark the access points identifying the endpoints of the route.

In block 710, the editor logic receives user input in the GUI, where the use input selects one of the active routes. For example, in some embodiments the user may click on a visual object (e.g., such as pin) that indicates the endpoint of a particular route. In another example, in some embodiments the user may simply hover in the GUI with a mouse pointer over the visual object (e.g., pin) indicating the endpoint of the route of interest and/or over the visual object (e.g., broken line) indicating the route itself.

In block 712, the editor logic computes the resistance value of the selected route in accordance with the techniques described herein, and displays the resistance value in the GUI. For example, the editor logic may display the route resistance and the endpoint access points of the route in the dialog box that was rendered by the operations in block 706.

IV. EXAMPLES OF USER INTERFACES

Figure 8A:
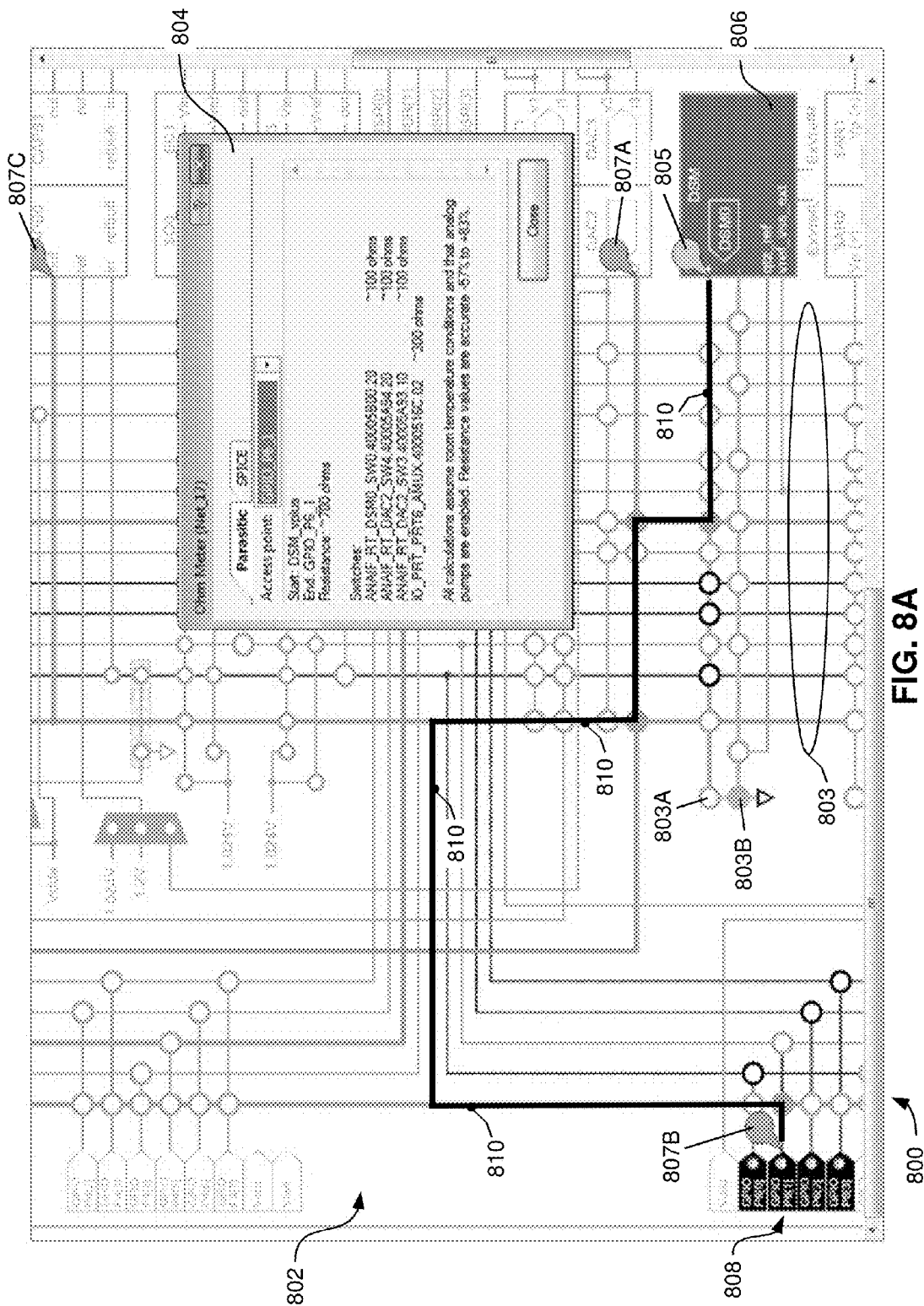
FIG. 8A is a block diagram illustrating an example user interface displaying, with respect to a portion of an electronic design, an analog route and its associated resistance value according to one embodiment.

FIG. 8A is a block diagram illustrating an example user interface according to an example embodiment. In this embodiment, graphical user interface (GUI) 800 displays a portion 802 of an electronic design for a programmable target device. Design portion 802 illustrates one or more analog interconnects, such as an analog interconnect 803, that include a number of traces can connect numerous analog components of the target device over multiple routes. As shown in FIG. 8A, analog interconnect 803 includes numerous analog switches, e.g., such as switches 803A and 803B, that are illustrated as circles. (It is noted that an empty circle illustrates a switch that is programmed in an "open", non-conducting position such as switch 803A, and a filled-in circle illustrates a switch that is programmed in a "closed", signal-conducting position such as switch 803B.)

In FIG. 8A, GUI 800 includes dialog box 804 (labeled "Ohm Meter") which shows the resistance value of a user-selected analog route 810 between the positive ("+") terminal of DSM 806 (labeled "DSM0") and I/O pin 808 (labeled "GPIO P6[1]"). According to the techniques for determining analog route resistance described herein, GUI 800 allows a user/designer to automatically obtain, in dialog box 804, an approximate resistance value for analog route 810. In this manner, the techniques described herein allow the user/designer to validate the analog route 810 between DSM 806 and I/O pin 808, and to analyze whether the route resistance would be significant (e.g., would cause an undesirable voltage drop) during operation of the target device for which the electronic design is placed and routed. It is noted that the electronic design illustrated in GUI 800 is placed and routed for a programmable target device, and thus the device provides multiple analog routes between DSM 806 and I/O pin 808 on which an analog signal can be conducted.

In one operational example regarding GUI 800, a user/designer invokes the analog resistance functionality through the program or logic that operates GUI 800. In response, the program/logic prompts the user to select the start point of a route of interest. In the example of FIG. 8A, the user/designer may use a pointing device (e.g., a mouse) to select (e.g., click on) the positive "+" terminal of DSM 806. In accordance with the techniques described herein, the program/logic displays visual object (e.g., pin) 805 on the selected terminal of DSM 806 and then automatically determines all active analog routes that are accessible from the selected terminal. As illustrated in FIG. 8A, one such active route starting from DSM 806 ends at a DAC and the program/logic displays visual object (e.g. pin) 807A to mark the endpoint of that route. Another active route starting from DSM 806 ends at I/O pin 808 and the program/logic displays a visual object (e.g., pin) 807B to mark the endpoint of that route. Another active route starting from DSM 806 ends at an analog block and the program/logic displays a visual object (e.g., pin) 807C to mark the endpoint of that route. (In some embodiments, the visual pin objects—e.g., such as pins 807A, 807B, and 807C—may be displayed in the GUI in two or more different colors in order to aid the user/designer's visual perception.) After displaying the active routes by marking them with visual objects 807A, 807B, and 807C in GUI 800, the program/logic prompts the user/designer to select the route of interest. In FIG. 8A, the user/designer selects analog route 810 (e.g., by clicking on visual pin object 807B). In response, the program/logic may highlight analog route 810 by an appropriate visual object—e.g., such as a thicker line or a line in a certain color. Further, according to the techniques described herein, the program/logic computes the resistance of route 810. The program logic then displays in dialog box 804 the following: an identifier of the start point of the route ("DSM_vplus", which is positive terminal of DSM 806); an identifier of the endpoint of the route ("GPIO P6[1]", which is I/O pin 808); the computed resistance ("~700 ohms") of analog route 810; the identifier of each switch on the route and its resistance value that was retrieved from a database (e.g., such as switch "ANAIF_RT_DSM0_SW0.40005B00.20" with resistance of "~100 ohms"); and a notification to the user/designer indicating the temperature and/or other operation condition(s) under which the resistance value of the route is determined.

As displayed in dialog box 804, the route resistance value of analog route 810 is approximate since it is based on: (1) specification values of the resistances of the switches on the route, which values are obtained based on an assumption of a certain temperature and other operation conditions; and (2) an approximated value (e.g., of 100 ohms) for the resistance of the traces that connect the switches on the route. It is noted, however, that even though the resistance value for analog route 810 is not exact with respect to all temperatures and conditions, it is still very useful because it allows the user/designer to validate the design portion 802 and make a better choice (if necessary) by seeing the route illustrated in GUI 800 (along with its traces and switches) and their approximate resistance values, thereby catching any potential problems early in the design process.

Figure 8B:
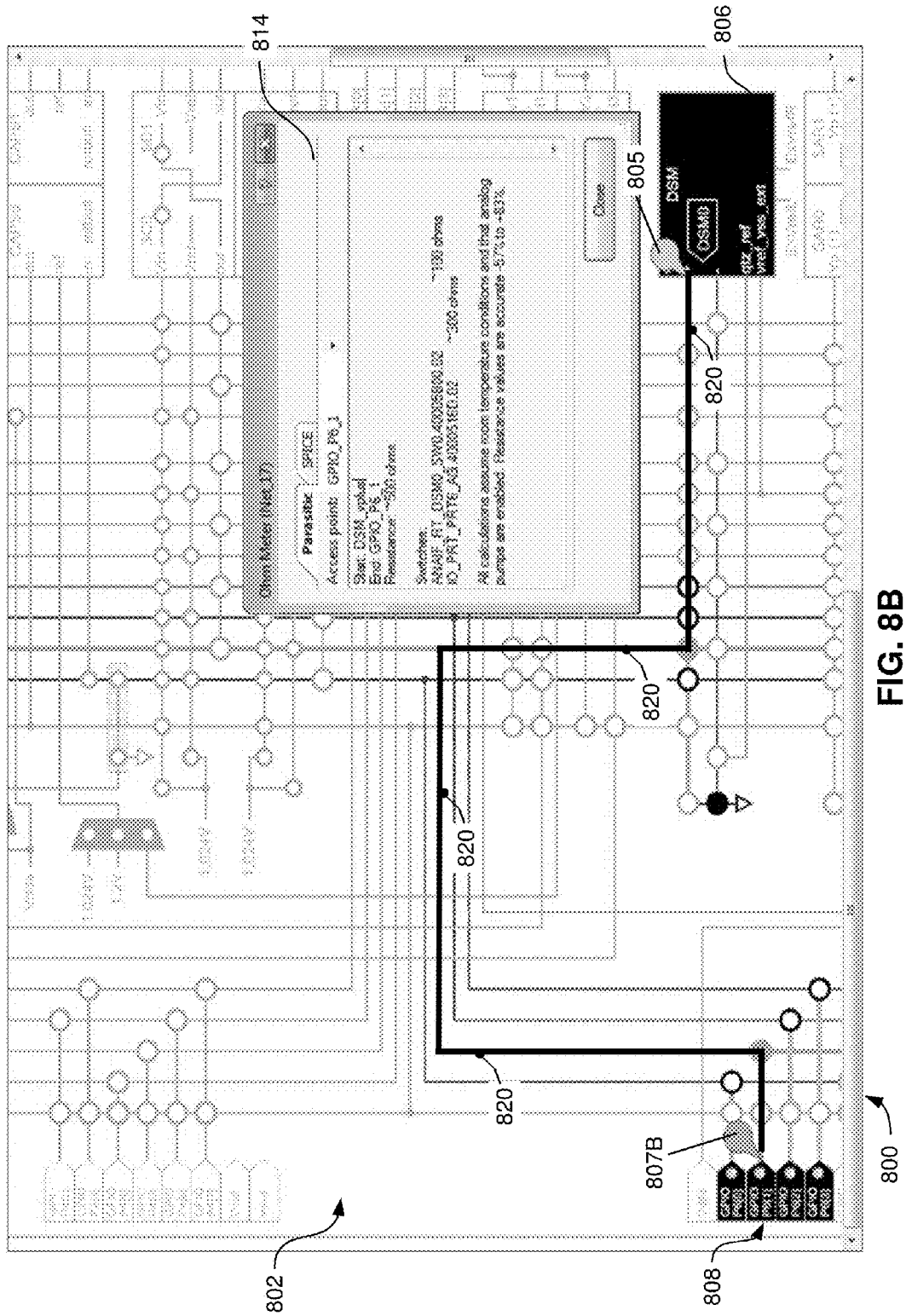
FIG. 8B is a block diagram illustrating an example user interface displaying the portion of the electronic design of FIG. 8A, but with an alternative route and its associated resistance value.

For example, the usefulness of the information displayed in dialog box 804 is illustrated in FIG. 8B. After seeing analog route 810 displayed in GUI 800 and considering its resistance (of approximately 700 ohms), the user/designer may realize that there could be an alternative route between the same endpoints (DSM 806 and I/O pin 808) that has less resistance. Specifically, as illustrated in FIG. 8B, the user/designer can select an alternative route such as analog route 820. Analog route 820 has the same start and endpoints as analog route 810 (e.g., positive terminal of DSM 806 and I/O pin 808), but apparently passes through fewer switches. According to the techniques described herein, the program or logic operating GUI 800 allows the user/designer to select analog route 820 by any suitable GUI-interaction mechanisms. For example, the program/logic may allow the user/designer to click on the visual objects representing the switches which the user/designer wants to be included in the alternative route (e.g., route 820); in response, the program/logic moves the broken line representing the alternative route through the alternative switches, computes the resistance of the alternative route, and displays the computed resistance of the alternative route along with the route endpoints and the resistance values of the alternative switches. In another example, the program/logic may allow the user/designer to drag the visual object (e.g., broken line) of the route (e.g., route 810) already displayed in the GUI over an alternative route that includes alternative switches and/or traces; in response, the program/logic moves computes the resistance of the alternative route, and displays the resistance of the alternative route along with the route endpoints and the resistance values of the alternative switches. It is noted that in some embodiments, the program/logic operating the GUI may be configured to notify the user/designer through suitable GUI-interaction mechanisms (e.g., text boxes, message boxes, alert notifications, etc.) when the user/designer selects an alternative route that is inactive or otherwise invalid.

For example, as illustrated in FIG. 8B, the user/designer selects alternative route 820 between DSM 806 and I/O pin 808 by any suitable GUI-interaction mechanism. In response, according to the techniques described herein, the program/logic computes the resistance of the user-selected alternative route 820. The program/logic then displays in dialog box 814 the following: an identifier of the start point of the route ("DSM_vplus", which is the positive terminal of DSM 806); an identifier of the endpoint of the route ("GPIO P6[1]", which is I/O pin 808); the computed resistance ("~500 ohms") of analog route 820; an identifier of each switch on the route and its resistance value that was retrieved from a database (e.g., such as switch "ANAIF_RT_DSM0_SW0.40005B00.02" with resistance of "~100 ohms"); and a notification to the user/designer indicating the temperature and/or other condition(s) under which the resistance value of the route is determined. As illustrated in dialog box 814, the resistance value of route 820 is approximately 500 ohms, which is less than the resistance of route 810 (which was computed as ~700 ohms) at least because route 820 includes two fewer switches than route 810. At this point, the program/logic operating GUI 800 may allow the user/designer to save the configuration with the alternative route in the electronic design (e.g., by allowing and/or prompting the user/designer to click on the appropriate button or menu). In this manner, the techniques for determining route resistance described herein allow the user/designer to chose a route with less resistance between two analog components or blocks of the electronic design, thereby optimizing the design quickly and interactively at a very early stage. It is noted that without the functionality provided by the techniques described herein, it would be almost impossible for the user/designer to realize and/or evaluate that there is a substantial difference between route 810 (which is placed and routed automatically) and the alternative route 820 (which is an available and valid route).

In some embodiments, a program or logic displays the resistance computed for a user-selected route in a visual object (e.g., such as a dialog box, text box, etc.) that is rendered in a particular view or workspace area of a GUI. In these embodiments, the program/logic displays in the visual object the resistance on a route between pairs of points, such as I/O pins and/or analog blocks (but possibly not wires or switches). As rendered in the GUI, the visual object is not modal so that the user/designer can change access points in the GUI and can see the route resistances without waiting for a new visual object to be displayed.

In some embodiments, a program or logic displays the visual object with the resistance computed for a user-selected route in response to user input that places a virtual probe into the electronic design, where the probe may be in the form of a graphical and/or textual input. In these embodiments, such probes may be placed on various design resources such as I/O pins, analog components, and/or other analog blocks of the electronic design. The placement of probes may be triggered when the program/logic receives a mouse click on a menu associated with the resource. When the target resource has more than one terminal (e.g., such as the $V_{ref}$, the $V_{in}$ and $V_{out}$ terminals of a block), the menu may have a pull-right or pull-down listing of the available terminal choices. In some embodiments, such probes may be displayed in the GUI with a visual object (e.g., such as a pin) that is attached to a visual object that represents the user-selected components. In these embodiments, the first-placed visual object may have a certain color (e.g., a green pin); in response to placing the first visual object in the GUI, the program/logic automatically determines the endpoints of all active and valid routes and marks them with second visual objects that have a different color (e.g., blue pins). When a probe is placed this way, the program/logic may also display instructions to the user/designer on how to select the subsequent destination probes. The program/logic may then receive input from the user/designer that selects one of the second visual objects (e.g., a left-click on a blue pin) and, in response, would update the resistance information that is displayed for the selected route. When the program/logic receives user input that places a new probe in the GUI, the program/logic clears the results for the previous route and refreshes the GUI with the valid visual objects (e.g., blue pins) for the new route.

In some embodiments, the techniques described herein provide for honoring the firmware configurations that govern the operation of switches, multiplexers, and other components of the analog interconnects in a programmable device. For example, according to the techniques described herein, a program or logic would not display any routes that are inactive or invalid based on the particular configuration of the particular interconnect components used by an electronic design.

Figure 8C:
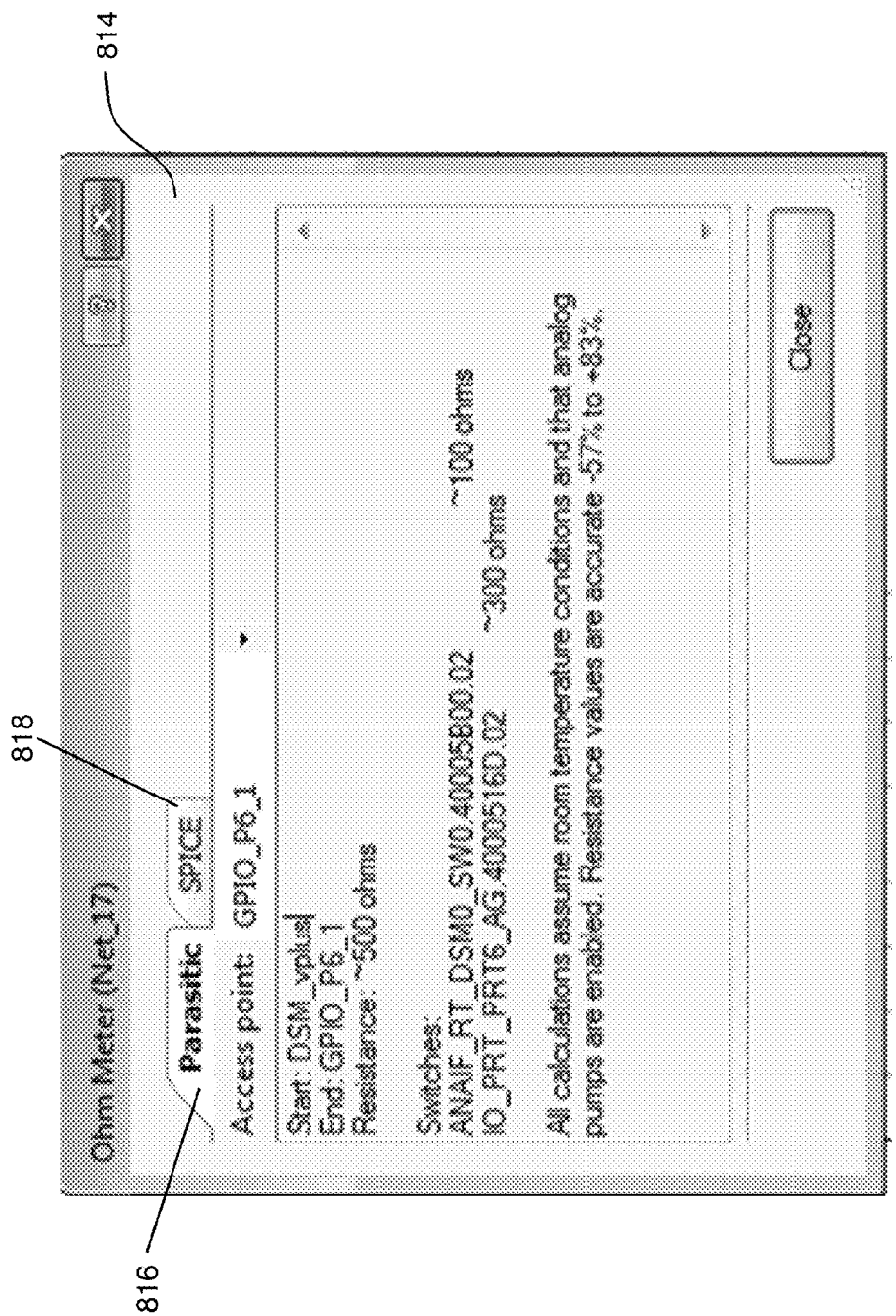
FIG. 8C is a block diagram illustrating an example "ohm meter" dialog box that specifies the alternative route of FIG. 8B with its associated resistance value.

FIG. 8C is a block diagram illustrating more details of dialog box 814, which specifies the alternative route of FIG. 8B with the various information computed for that route in accordance with the techniques described herein. Dialog box 814 includes two tabs, parasitic resistance tab 816 (labeled as "Parasitic") and SPICE tab 818 (labeled as "SPICE"). As discussed above with respect to FIG. 8B, tab 816 includes an identifier of the start point of route 820, an identifier of the endpoint of the route, the computed resistance of the route, an identifier of each switch on the route and its resistance value that was retrieved from a database, and a notification indicating the temperature and/or other condition(s) under which the resistance value of the route is determined. Tab 818 includes a SPICE output and related information (e.g., such as SPICE route data).

In some embodiments, when a program or logic receives input data with the user route selections, the parasitic resistance tab (e.g., such as tab 816 in FIG. 8C) would display the resistance between the two endpoints of the selected route with an associated precision (e.g., such as "+/−" percentage points). In some embodiments, a program or logic would compute the route resistance as the sum of all switch resistances along the route from the worst case values with an analog voltage or current boost enabled at room temperature. Since such computations may yield variable numbers—e.g., based on the temperature, process, and signal voltage—the computed route resistances may be rounded to a single significant digit or an order of magnitude. In some embodiments, a program or logic would not adjust the computed route resistances for different operating conditions because the precision given for the switch resistances (e.g., as stored in a database for the target device) is comparable to the environmental variation.

In some embodiments, a program or logic may display SPICE output and other SPICE route data for an analog route for which route resistance is determined according to the techniques described herein. For example, the program/logic may render an additional visual object (e.g., such as tab 818 in FIG. 8C) that displays computed SPICE information such as SPICE netlist for the user-selected analog route. The information in the SPICE visual object may be displayed as text, and the visual object may include a button (e.g., "Copy" button) or other visual mechanism that can trigger a function to copy and/or paste the displayed SPICE output into a destination (e.g., such as a file, the clipboard, a simulator program, etc.) of the user/designer's choice. In some embodiments, the SPICE output generated by the program/logic may be compatible with one or more SPICE tools (e.g., such as HSPICE, PSPICE, and NGSPICE) tools for selected nets in the underlying electronic design.

Figure 9A:
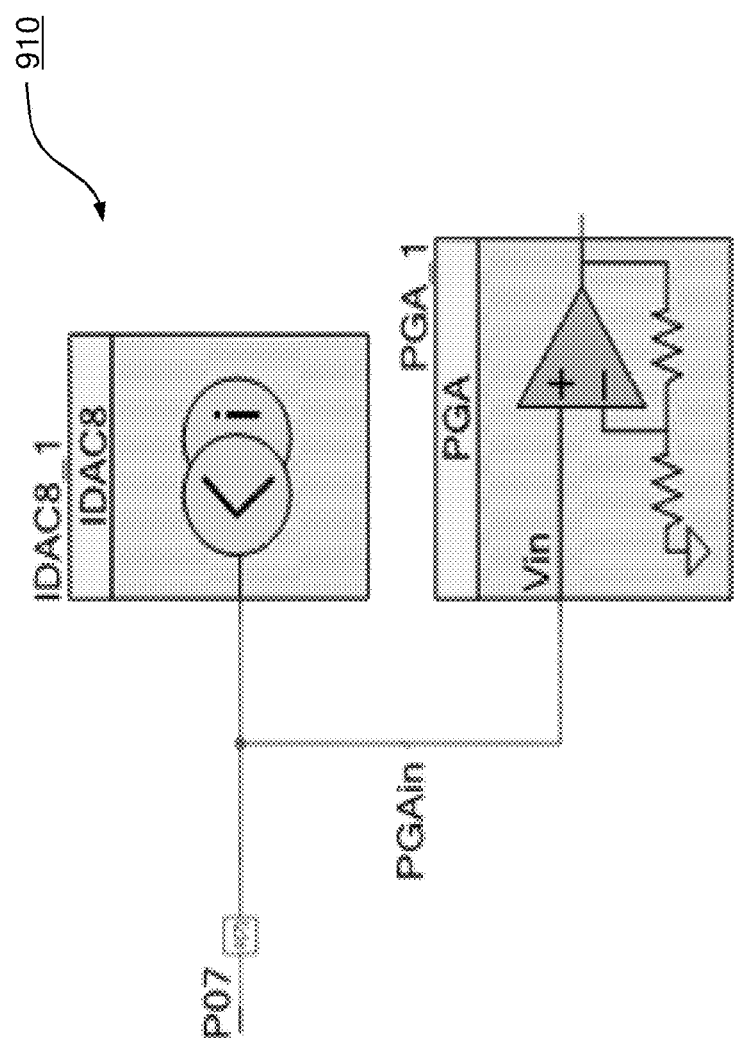
FIG. 9A is a block diagram illustrating an example circuit schematic for which SPICE (Simulation Program with Integrated Circuit Emphasis) output can be generated in accordance with one embodiment.

FIG. 9A is a block diagram illustrating circuit schematic 910 for which SPICE output can be generated in accordance with some embodiments of the techniques for determining route resistance described herein. For example, schematic 910 may be created by a user/designer in a schematic design tool such as a schematic editor, a symbol editor, or the like. After receiving an electronic representation of schematic 910, in these embodiments a program or logic may determine and display the resistance of a user-selected route as described heretofore. In addition, the program/logic may display a visual object (e.g., such as tab 818 in FIG. 8C) that includes the SPICE output for the entire net that the user-selected route is a part of.

FIG. 9B illustrates visual object 918 (e.g., such as tab 818 in FIG. 8C), which includes the SPICE output 920 (in list format) for the circuit schematic 910 in FIG. 9A. Visual object 918 may include a button (or other GUI-interaction mechanism) that provides for copying SPICE output 920 to memory and/or to persistent storage, which allows the user/designer to subsequently evaluate the SPICE output by pasting and/or loading it into a circuit simulator program.

Figure 9C:
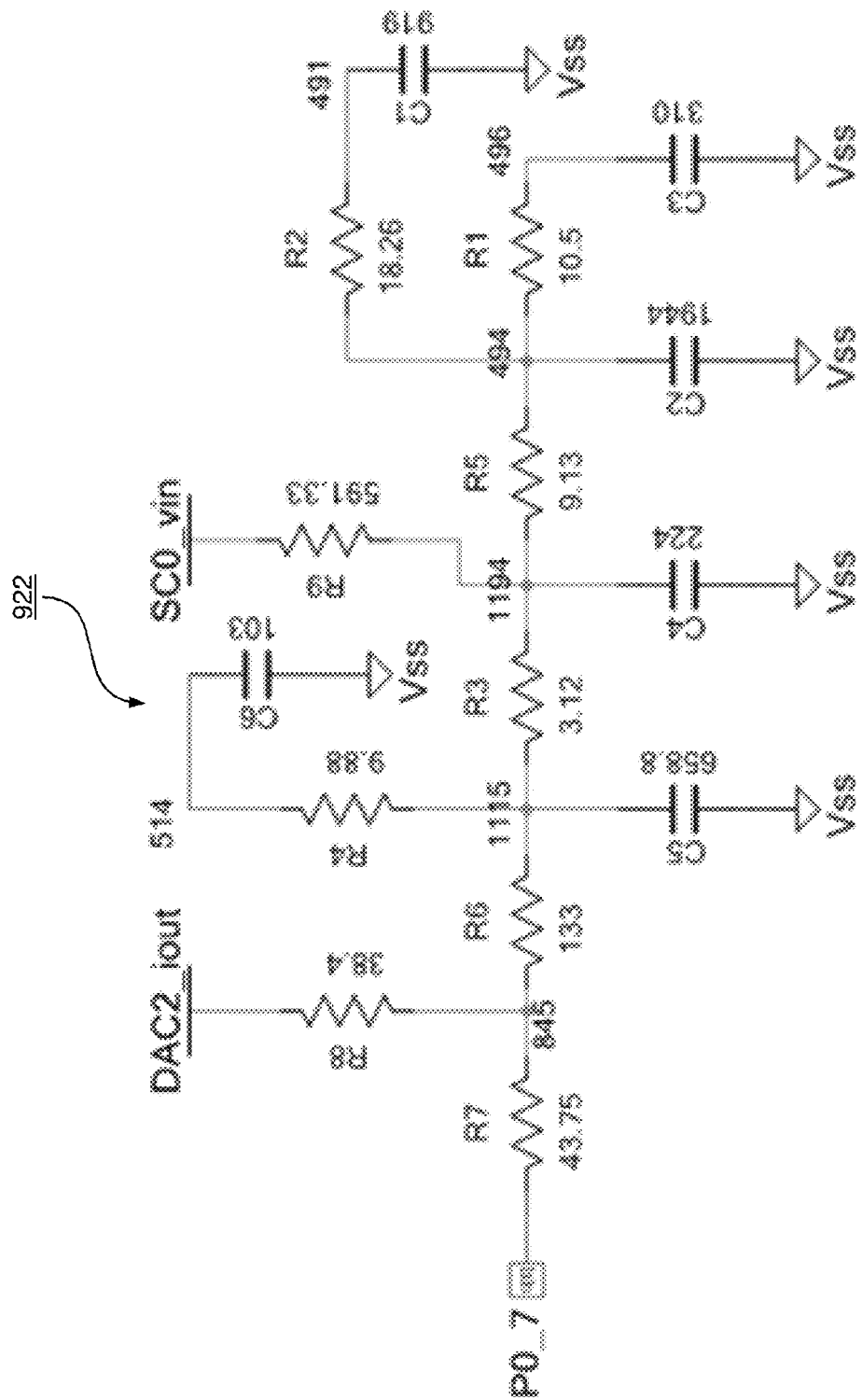
FIG. 9C is a block diagram illustrating a SPICE circuit that models the resistance and capacitance according to the SPICE output illustrated in FIG. 9B.

FIG. 9C illustrates SPICE circuit 922 that models the resistances and capacitances of schematic 910 (in FIG. 9A) according to SPICE output 920 (in FIG. 9B). In general, a SPICE model circuit simulates an actual circuit by using virtual components to represent the real electrical effects on the actual circuit. In FIG. 9C, SPICE circuit 922 models capacitances and resistances for the nets in circuit 910 by showing virtual components (resistances, capacitors, capacitances between long traces, etc.) that are coupled between the nodes in the nets. For example, if there is some capacitance between a node and a ground, SPICE output 920 and SPICE circuit 922 would represent this capacitance as a capacitor coupled between the node and the ground; if there is some resistance between two nodes, SPICE output 920 and SPICE circuit 922 would represent this resistance as a resistor coupled between the two nodes. In this manner, the techniques described herein allow the user/designer to use the SPICE output generated for a user-selected route as an input to a SPICE tool for further AC/DC analysis.

V. EXAMPLE USAGE

Figure 10A:
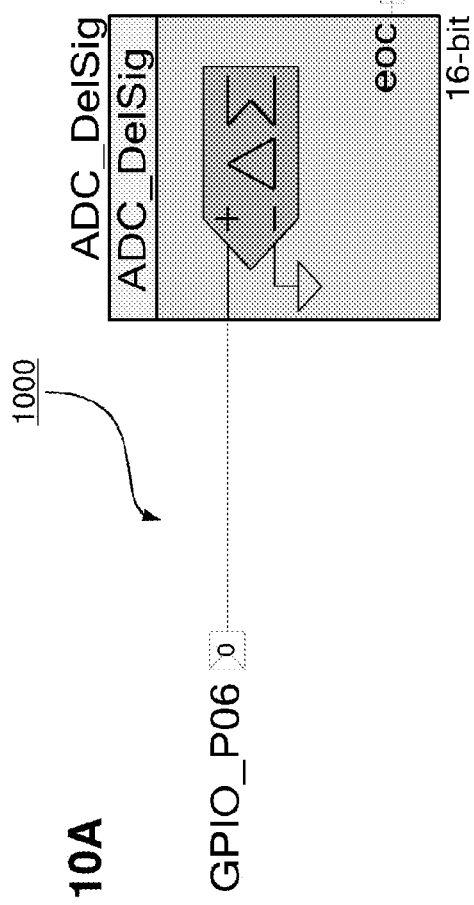
FIG. 10A is a block diagram illustrating a schematic of an example circuit for which analog route resistance can be determined in accordance with one embodiment.

FIG. 10A illustrates schematic 1000 of an example circuit for which analog route resistance can be determined in accordance with one embodiment of the techniques described herein. Schematic 1000 may be part of an electronic design that is placed and routed for a programmable target device, which includes an internal analog interconnect that provides many different routing options when conducting signals between analog blocks, components, and pins. In such programmable device, the signal routes and switches required to provide this flexibility also add resistance between the signal source and its destination. Table 1 below illustrates the typical resistance values for some of the traces and switches in the programmable target device.

TABLE 1

Approximate Resistances of Internal Traces and Switches Ohms (Ω)

| Component Type | Typical Resistance |
|---|---|
| Small Switch | 500-700 Ω |
| Large Switch | 200-350 Ω |
| XLarge Switch | ~50 Ω |
| Analog Global Bus | ~200 Ω |
| Analog Mux Bus | ~100 Ω |
| Analog Local Bus | ~100 Ω |

It is noted that Table 1 provides approximated resistance values for the worse case resistance of each analog trace and switch. Further, the resistance values illustrated in Table 1 may be stored in a database for the programmable target device along with other values, properties, and characterizations of the device.

Figure 10B:
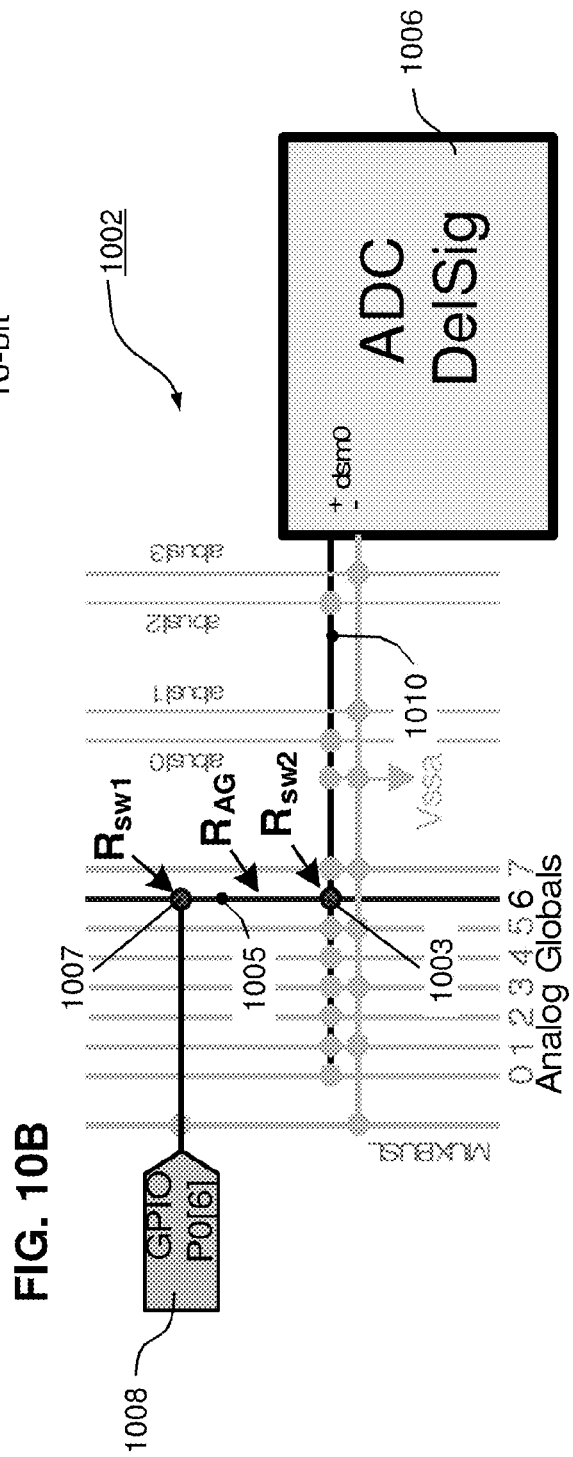
FIG. 10B is a block diagram illustrating an example user interface displaying, with respect to a portion of an electronic design, an analog route that implements the example circuit of FIG. 10A.

FIG. 10B illustrates routing diagram 1002 for analog route 1010 that implements schematic 1000 in the programmable target device. (It is noted that routing diagram 1002 can be a part of an electronic design that is displayed in a GUI as described heretofore.) Analog route 1010 represents a circuit between the positive input terminal of ADC 1006 (labeled as "ADC_DelSig") and I/O pin 1008 (labeled as "GPIO_P0[6]"). As illustrated in FIG. 10B, analog route 1010 passes through several resistive elements, namely: switch 1003 (labeled as "$R_{SW2}$"); analog global bus 1005 (labeled as "$R_{AG}$"); and switch 1007 (labeled as "$R_{SW1}$"). To determine the total resistance of analog route 1010, in the embodiment of FIG. 10B a program or logic looks up the type of the resistive elements in a database (e.g., that may store the values from Table 1 above), retrieves the resistance of each resistive element, and adds up the retrieved resistances to obtain the total resistance value of the analog route.

For example, the program/logic may approximate the total resistance value of analog route 1010 by computing the following equations:

$$R_{TOTAL} = R_{SW1} + R_{AG} + R_{SW2} \quad \text{(Equation 1)}$$

where "$R_{SW1}$" is the looked-up resistance value of switch 1007, "$R_{AG}$" is the looked-up resistance value of analog global bus 1005, "$R_{SW2}$" is the looked-up resistance value of switch 1003, and "$R_{TOTAL}$" is computed resistance value of analog route 1010. The looked-up values substituted in Equation 1 are provided in Equation 2 below:

$$R_{TOTAL} = 250_{SW1} + 200_{AG} + 250_{SW2} = 700\Omega \quad \text{(Equation 2)}$$

As Equation 2 illustrates, the total resistance value of analog route 1010 is about 700 ohms (Ω). The actual resistance value of analog route 1010 may be less because: the resistances of some of the resistive elements in the route (e.g., such as the analog global bus, as shown in Table 1) are the worst case; the resistances stored in the database for the resistive elements are model values typically between the absolute minimum and maximum; and a signal traversing the analog route travels only a section of analog global bus 1005 so the resistance of the section will be less than the resistance of the entire bus as listed in the database.

In the above manner, the techniques described herein allow a user/designer to determine the (approximate) resistance of analog route 1010. This allows the user/designer to ask the question "Does the 700Ω affect the design?"

Figure 10C:
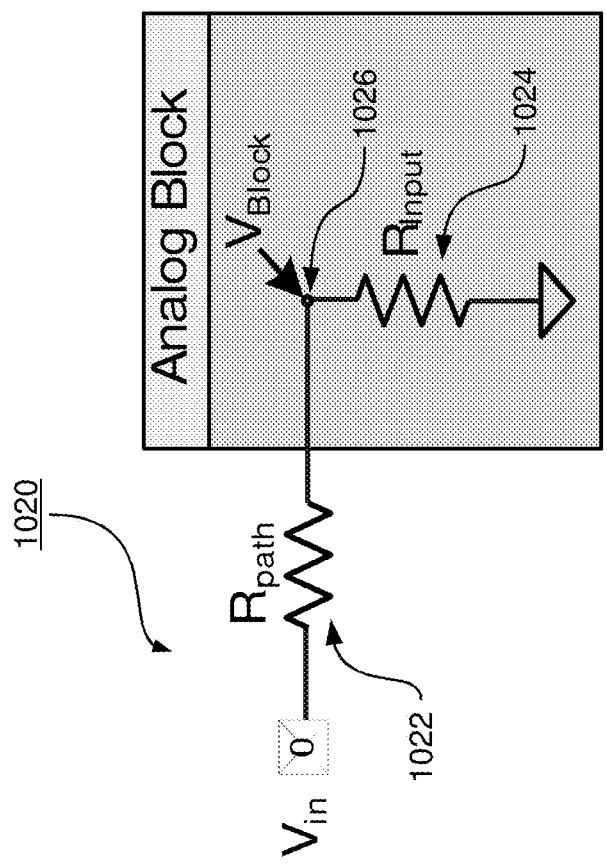
FIG. 10C is a block diagram illustrating an equivalent resistance circuit for an analog block having non-zero non-infinite resistance in accordance with an example embodiment.

FIG. 10C illustrates schematic 1020 of an equivalent resistance circuit for analog block 1026 (labeled as "$V_{BLOCK}$") that has an input resistance more than zero and less than infinity. It is noted that analog block 1026 may be used to model a resistance that is equivalent to the resistance of ADC 1006 (in FIG. 10B). In FIG. 10C, the two resistors 1022 (labeled as "$R_{PATH}$") and 1024 (labeled as "$R_{INPUT}$") form a voltage divider so the actual voltage seen at the input by an analog block 1026 is not the same as the input voltage $V_{IN}$. The following Equation 3 can be used to calculate the error created due to the resistance of resistors 1022 and 1024:

$$\% \text{ ERROR} = \frac{R_{PATH}}{(R_{INPUT} + R_{PATH})} * 100 \quad \text{(Equation 3)}$$

where "$R_{PATH}$" is the resistance of resistor 1022, "$R_{INPUT}$" is the resistance of resistor 1024, and "% ERROR" is the error created due to the resistance of the two resistors.

Referring back to the example of FIG. 10B, suppose that the allowable/typical input resistance of ADC 1006 is 100 MΩ or above. Since per Equation 2 the computed resistance of analog route 1010 is approximately 700Ω, substituting these values in Equation 3 results in Equation 4 below:

$$\% \text{ ERROR} = \frac{700}{(100{,}000{,}000 + 700)} * 100 = 0.0007\% \quad \text{(Equation 4)}$$

Equation 4 indicates that, because the input resistance of ADC 1006 is about or greater than 100 MΩ and the resistance of analog route 1010 is about or less than 700 Ω, the error introduced by the analog route resistance would be less than 0.0007% or 7 ppm, which is likely insignificant for most applications. However, if the allowable/typical input resistance of ADC 1006 is much less than 100 MΩ (e.g., such as 100KΩ), then per Equation 3 the error introduced by the resistance of analog route 1010 would be about 0.69% or 6900 ppm, which may be significant for some applications.

VI. ALTERNATIVE EMBODIMENTS

In some embodiments, in addition to determining analog route resistance, the techniques described herein may provide one or more additional GUI functionalities. For example, a program or logic may allow a user/designer to perform a mouse hover over a visual object that represents a resistive element in the electronic design that is displayed in a GUI. In response to detecting the hover action, the program/logic may obtain an identifier of the resistive element based on the visual object, look up the resistive element in a database based on the identifier, retrieve the resistance of the resistive element from the database, and then display the retrieved resistance value next to the resistive element in the GUI. In this manner, the techniques described herein allow the user/designer to obtain the resistance value of a resistive element without having to actually specify an analog route through the resistive element in the electronic design.

In some embodiments, in addition to determining analog route resistance, the techniques described herein may compute the frequency response of an analog route that is affected by some capacitance. For example, based on the SPICE output for an analog route, a program or logic may automatically determine one or more capacitances that exist between various portions of the route and ground. Based on theses capacitances, the program/logic may then determine the impedance of the analog route, and may then use the impedance to determine the frequency response of the analog route. The program/logic may then display the determined frequency response in association with the analog route by using a suitable visual object in a GUI (e.g., in a dialog box, a tab, etc).

In some embodiments, the techniques described herein may provide actual (e.g., non-approximated) resistance values for an analog route. For example, if enough characterizations of a programmable target device (e.g., temperature ranges, voltage ranges, etc.) are simulated, performed, and/or measured and stored in the database for the device, then a program/logic performing the techniques described herein would obtain an accurate value for an analog route in an electronic design that is placed and routed for the device. In these embodiments, the program/logic may prompt the user/designer to input or otherwise specify the operating conditions (e.g., a source voltage range, a temperature range, etc.) for the resistive elements in an analog route, and may then compute the resistance value of the analog route based on the elements' resistances that correspond to the operating condition ranges in the database.

In some embodiments, in addition to determining analog route resistance, the techniques described herein may provide one or more additional GUI functionalities. For example, a program or logic may be configured to receive user input that follows (or traces) the path of an analog route in a visual representation of an electronic design that is displayed in a GUI. Based on the received input, the program/logic then determines the endpoints of the analog route indicated by the user input and, if the user-traced route is active, computes the resistance value of the analog route as described heretofore. In this manner, the techniques described herein allow a user/designer to avail herself of the resistance-determining functionality without actually having a schematic of the analog route, which can provide a good idea of the magnitude of the resistances that the user/designer can expect in a certain portion of the electronic design.

VII. CONCLUSION

The techniques for determining analog route resistance described herein allow a user/designer to have more insight of the actual resistances of analog routes in an electronic design that is placed and routed for a programmable target device. The techniques described herein help the user/designer to understand what voltage drops can occur when currents as small as a micro-amp pass through switches and traces on a given analog route. Further, through intuitive and interactive GUIs, the techniques described herein allow the user/designer to select and analyze alternative routes in order to fix or optimize an electronic design at a very early stage in the design process. Without the information provided by the techniques describe herein in such interactive and intuitive GUI, it is difficult (if at all possible) to determine the cause of an excessive voltage drop or to avoid high-resistance routes, especially for complicated routes that may include numerous hubs, switches, traces and other resistive elements.

Various embodiments of the techniques for determining analog route resistance described herein may include various operations. These operations may be performed by hardware components, software, firmware, or a combination thereof. As used herein, the term "coupled to" may mean coupled directly or indirectly through one or more intervening components. Any of the signals provided over various buses and switches described herein may be time multiplexed with other signals and provided over one or more common buses. Additionally, the interconnection between circuit components or blocks may be described and shown as buses or as single signal lines. Each of the buses may alternatively be one or more single signal lines and each of the single signal lines may alternatively be buses.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
   receiving first user input that indicates, in a user interface, a first component in an electronic design, wherein the electronic design has been placed and routed for a programmable target device;
   determining one or more second components of the electronic design that have analog connectivity to the first component;

displaying, in the user interface, one or more visual objects that indicate the one or more second components;

receiving second user input that selects, in the user interface, a particular component from the one or more second components of the electronic design;

determining a resistance value of an analog route between the first component and the particular component; and displaying, in a visual object of the user interface, an identifier of the analog route and the resistance value in association with the analog route between the first component and the particular component;

wherein the method is performed by one or more computer systems.

2. The method of claim 1, further comprising:

in response to receiving the first user input and prior to receiving the second user input, performing steps comprising:

displaying a specific visual object in the user interface, wherein the specific visual object indicates a first location of the first component in a graphical representation of the electronic design;

determining one or more second locations of the one or more second components in the electronic design; and displaying, in the graphical representation of the electronic design in the user interface, the one or more visual objects that indicate the one or more second locations of the one or more second components.

3. The method of claim 1, wherein receiving the second user input comprises receiving input data that traces, in the user interface, the analog route between the first component and the particular component.

4. The method of claim 1, wherein determining the resistance value of the analog route between the first component and the particular component comprises:

determining one or more resistive elements that are included in the analog route;

looking up one or more model resistances of the one or more resistive elements; and determining the resistance value based on the one or model more resistances.

5. The method of claim 1, wherein displaying the resistance value in association with the analog route includes rendering the visual object in the user interface.

6. The method of claim 1, further comprising:

generating a SPICE output for at least one portion of the analog route between the first component and the particular component; and displaying the SPICE output in the user interface.

7. The method of claim 1, wherein the analog route includes multiple resistive elements.

8. The method of claim 7, wherein the multiple resistive elements of the analog route include a switch, and wherein the analog route is active in accordance with a firmware configuration of the switch.

9. The method of claim 7, wherein the resistance value of the analog route is an approximate value that is computed based on resistances of the multiple resistive elements.

10. The method of claim 1, further comprising receiving third user input that indicates operating temperature and voltage, wherein determining the resistance value of the analog route comprises computing the resistance value based on the operating temperature and voltage.

11. A non-transitory computer-readable medium storing a set of instructions that comprise instructions which, when executed by one or more processors, cause the one or more processors to perform steps comprising:

receiving first user input that indicates, in a user interface, a first component in an electronic design, wherein the electronic design has been placed and routed for a programmable target device;

determining one or more second components of the electronic design that have analog connectivity to the first component;

displaying, in the user interface, one or more visual objects that indicate the one or more second components;

receiving second user input that selects, in the user interface, a particular component from the one or more second components of the electronic design;

determining a resistance value of an analog route between the first component and the particular component; and displaying, in a visual object of the user interface, an identifier of the analog route and the resistance value in association with the analog route between the first component and the particular component.

12. The non-transitory computer-readable medium of claim 11, wherein the set of instructions further comprises instructions which, when executed by the one or more processors in response to receiving the first user input and prior to receiving the second user input, cause the one or more processors to perform:

displaying a specific visual object in the user interface, wherein the specific visual object indicates a first location of the first component in a graphical representation of the electronic design;

determining one or more second locations of the one or more second components in the electronic design; and displaying, in the graphical representation of the electronic design in the user interface, the one or more visual objects that indicate the one or more second locations of the one or more second components.

13. The non-transitory computer-readable medium of claim 11, wherein the instructions that cause receiving the second user input comprise instructions which, when executed by the one or more processors, cause the one or more processors to receive input data that traces, in the user interface, the analog route between the first component and the particular component.

14. The non-transitory computer-readable medium of claim 11, wherein the instructions that cause determining the resistance value of the analog route comprise instructions which, when executed by the one or more processors, cause the one or more processors to perform:

determining one or more resistive elements that are included in the analog route;

looking up one or more model resistances of the one or more resistive elements; and determining the resistance value based on the one or more model resistances.

15. The non-transitory computer-readable medium of claim 11, wherein the instructions that cause displaying the resistance value include instructions which, when executed by the one or more processors, cause the one or more processors to render the visual object in the user interface.

16. The non-transitory computer-readable medium of claim 11, wherein the set of instructions further comprises instructions which, when executed by the one or more processors, cause the one or more processors to perform:

generating a SPICE output for at least one portion of the analog route between the first component and the particular component; and displaying the SPICE output in the user interface.

17. The non-transitory computer-readable medium of claim 11, wherein the analog route includes multiple resistive elements.

18. The non-transitory computer-readable medium of claim 17, wherein the multiple resistive elements of the analog route include a switch, and wherein the analog route is active in accordance with a firmware configuration of the switch.

19. The non-transitory computer-readable medium of claim 17, wherein the resistance value of the analog route is an approximate value that is computed based on resistances of the multiple resistive elements.

20. The non-transitory computer-readable medium of claim 11, wherein the set of instructions further comprises instructions which, when executed by the one or more processors, cause the one or more processors to receive third user input that indicates operating temperature and voltage, and wherein the instructions that cause determining the resistance value of the analog route further comprise instructions which, when executed by the one or more processors, cause the one or more processors to compute the resistance value based on the operating temperature and voltage.

* * * * *